US011151073B1

(12) United States Patent
Bas et al.

(10) Patent No.: US 11,151,073 B1
(45) Date of Patent: Oct. 19, 2021

(54) AUGMENTING DATA PLANE FUNCTIONALITY WITH FIELD PROGRAMMABLE INTEGRATED CIRCUITS

(71) Applicant: Barefoot Networks, Inc., Santa Clara, CA (US)

(72) Inventors: Antonin Mathieu Bas, Palo Alto, CA (US); Anurag Agrawal, Santa Clara, CA (US); Changhoon Kim, Palo Alto, CA (US)

(73) Assignee: Barefoot Networks, Inc., Santa Clara, CA (US)

( * ) Notice: Subject to any disclaimer, the term of this patent is extended or adjusted under 35 U.S.C. 154(b) by 0 days.

(21) Appl. No.: 16/540,766

(22) Filed: Aug. 14, 2019

Related U.S. Application Data

(60) Provisional application No. 62/847,284, filed on May 13, 2019.

(51) Int. Cl.
*G06F 13/42* (2006.01)
*H03K 19/173* (2006.01)
*G06F 13/16* (2006.01)

(52) U.S. Cl.
CPC .......... *G06F 13/42* (2013.01); *G06F 13/1668* (2013.01); *H03K 19/173* (2013.01)

(58) Field of Classification Search
CPC .... G06F 13/42; G06F 13/1668; H03K 19/173
See application file for complete search history.

(56) References Cited

U.S. PATENT DOCUMENTS 9,529,531 B2 * 12/2016 Bosshart ................. G06F 3/064
10,067,967 B1 * 9/2018 Bosshart ............. G06F 16/2255
(Continued)

OTHER PUBLICATIONS

Non-Published commonly Owned U.S. Appl. No. 16/540,741, filed Aug. 14, 2019, 70 pages, Barefoot Networks, Inc.
(Continued)

*Primary Examiner* — Nimesh G Patel
(74) *Attorney, Agent, or Firm* — Compass IP Law PC

(57) ABSTRACT

Some embodiments use one or more FPGAs and external memories associated with the FPGAs to implement large, hash-addressable tables for a data plane circuit. These embodiments configure at least one message processing stage of the DP circuit to store (1) a first plurality of records for matching with a set of data messages received by the DP circuit, and (2) a redirection record redirecting data messages that do not match the first plurality of records to a DP egress port associated with the memory circuit. These embodiments configure an external memory circuit to store a larger, second set of records for matching with redirected data messages received through the DP egress port associated with the memory circuit. This external memory circuit is a hash-addressable memory in some embodiments. To determine whether a redirected data message matches a record in the second set of record, the method of some embodiments configures an FPGA associated with the hash-addressable external memory to use a collision free hash process to generate a collision-free, hash address value from a set of attributes of the data message. This hash address value specifies an address in the external memory for the record in the second set of records to compare with the redirected data message.

26 Claims, 17 Drawing Sheets

(56) References Cited

U.S. PATENT DOCUMENTS

| | | | |
|---|---|---|---|
| 10,158,573 B1* | 12/2018 | Lee | H04L 67/1002 |
| 10,257,122 B1* | 4/2019 | Li | H04L 45/745 |
| 10,298,456 B1* | 5/2019 | Chang | G06F 1/206 |
| 10,318,587 B1* | 6/2019 | Bosshart | H04L 45/742 |
| 2004/0255045 A1 | 12/2004 | Lim et al. | |
| 2010/0095064 A1 | 4/2010 | Aviles | |
| 2011/0320617 A1 | 12/2011 | Annamalaisami et al. | |
| 2012/0170575 A1 | 7/2012 | Mehra | |
| 2014/0169158 A1 | 6/2014 | Mishra et al. | |
| 2015/0078386 A1 | 3/2015 | Jackson et al. | |
| 2016/0124864 A1 | 5/2016 | Sun et al. | |
| 2017/0063992 A1* | 3/2017 | Baek | H04L 67/1002 |
| 2017/0220499 A1 | 8/2017 | Gray | |
| 2019/0082342 A1 | 3/2019 | Sharma et al. | |
| 2019/0108045 A1* | 4/2019 | Lee | G06F 11/3636 |
| 2019/0288938 A1 | 9/2019 | Song | |
| 2020/0028762 A1 | 1/2020 | Sun et al. | |
| 2020/0159678 A1* | 5/2020 | Kim | G06F 13/1668 |
| 2020/0213102 A1* | 7/2020 | Rahamim | G06F 3/0623 |

OTHER PUBLICATIONS

Non-Published commonly Owned U.S. Appl. No. 16/540,750, filed Aug. 14, 2019, 72 pages, Barefoot Networks, Inc.
Non-Published commonly Owned U.S. Appl. No. 16/540,773, filed Aug. 14, 2019, 71 pages, Barefoot Networks, Inc.
Notice of Allowance for U.S. Appl. No. 16/540,750, dated May 12, 2021, 9 pages.
First Office Action for U.S. Appl. No. 16/540,750, dated Dec. 7, 2020, 12 pages.
First Office Action for U.S. Appl. No. 16/540,773, dated Apr. 15, 2021, 19 pages.

* cited by examiner

AUGMENTING DATA PLANE FUNCTIONALITY WITH FIELD PROGRAMMABLE INTEGRATED CIRCUITS

BACKGROUND

In recent years, several configurable data plane circuits have been proposed. These circuits not only perform robust data message forwarding operations but also perform a myriad of other operations that forwarding circuits traditionally did not perform. With all of these functionalities the resources of the data plane circuits are in demand now more than ever. Accordingly, there is a need in the art for circuits and architectures to augment data plane functionality.

BRIEF SUMMARY

Some embodiments provide novel circuits for augmenting the functionality of a data plane circuit of a forwarding element with one or more field programmable circuits and external memory circuits. The data plane circuit of the forwarding element forwards data messages within a network. In some embodiments, the data plane circuit includes several message processing pipelines to process data messages to determine how to forward the data messages in the network. In some embodiments, the data plane circuit is an integrated circuit (IC). The data plane circuit (e.g., its message processing stages) are configured by a local control plane of the forwarding element, or a remote control plane operating on a separate device than the forwarding element.

In several embodiments described below, the field programmable circuits are field programmable gate arrays (FPGAs), but one of ordinary skill will realize that in other embodiments the field programmable circuits are other types of circuits, such as microprocessors, micro controllers, etc. In some embodiments, the forwarding element includes several FPGAs and several external memories associated with the FPGAs. The FPGAs connect the data plane circuit with the external memories associated with the FPGAs. In some embodiments, an FPGA's associated external memory is on the same IC die as the FPGA. In other embodiments, the associated external memory of the FPGA is on a different IC die than the FPGA.

The external memories in some embodiments serve as deep buffers that receive through one or more FPGAs a set of data messages from the data plane (DP) circuit to store temporarily. In some of these embodiments, one or more of the FPGAs implement schedulers that specify when data messages should be retrieved from the external memories and provided back to the data plane circuit for forwarding through the network. For instance, in some embodiments, a particular FPGA can perform a scheduling operation for a first set of data messages stored in its associated external memory, and can direct another FPGA to perform the scheduling operation for a second set of data messages stored in the particular FPGA's associated external memory. Specifically, in these embodiments, the particular FPGA determines when the first subset of data messages stored in its associated external memory should be forwarded back to the data plane circuit to forward to data messages in the network, while directing another FPGA to determine when a second subset of data messages stored in the particular FPGA's external memory should be forwarded back to the data plane circuit.

For the second subset of data messages, the particular FPGA in some embodiments provides metadata associated with the second subset of data messages to the other FPGA so that the other FPGA can use the metadata to perform the scheduling for the second subset of data messages. For example, in some embodiments, each time a particular data message in the second subset of data messages is stored in the external memory associated with the particular FPGA, the particular FPGA provides a set of metadata associated with the particular data message to the other FPGA. This other FPGA then uses the provided metadata to determine when the particular data message should be forwarded back to the data plane circuit to forward to data messages in the network. The provided metadata in some embodiments includes a priority level and/or a logical queue identifier for the data message, the eventual destination egress port to use to forward the data message through the network, etc. The logical queue identifier in some embodiments is used by the data plane circuit and the FPGAs to associate a priority level for a data message.

In some embodiments, the data plane circuit comprises several egress ports, and the data plane circuit implements the scheduler for some of these egress ports, while one or more FPGAs implement the schedulers for other subsets of data messages that need to exit the data plane circuit through other egress ports. For example, the data plane circuit in some embodiments includes several ingress and egress message processing pipelines and a traffic manager for forwarding data messages from the ingress message processing pipelines to the egress message processing pipelines. In some of these embodiments, the traffic manager implements the scheduler for data messages that should exit through a first set of egress ports (e.g., uplink ports) of the data plane circuit, while the FPGAs implement the schedulers for data messages that should exit through a second set of egress ports (e.g., downlink ports) of the data plane circuit. The different FPGAs in some embodiments implement the schedulers for different subsets of data messages that need to exit the data plane circuit through different egress ports.

The ingress processing pipelines in some embodiments identify the DP egress ports for forwarding the data messages to their destinations in the network. For a particular data message, an ingress pipeline also identifies in some embodiments a DP egress port that is scheduled by an FPGA. In such a case, the ingress pipeline in some embodiments specifies two egress ports, one that is the eventual egress port from which the data message should exit the data plane circuit, and another that is the egress port for forwarding the data message to an FPGA that will store the data message in its associated external memory. Each of these egress ports is associated with an egress pipeline. In some cases, the two egress ports can be associated with the same egress pipeline, or they can be associated with two different egress pipelines.

When the ingress pipeline determines that a particular data message should be directed to a destination egress port scheduled by the traffic manager, the traffic manager temporarily stores the data message in its set of buffers until such time that the traffic manager determines that the data messages should be forwarded to the egress pipeline associated with the destination egress port identified by the ingress pipeline. On the other hand, when the ingress pipeline determines that a particular data message should be directed to a destination egress port scheduled by a particular FPGA, the traffic manager directs the particular data message to an egress pipeline associated with the DP egress port associated with one of the FPGAs, either an FPGA that implements the scheduler for this data message or an FPGA that handles the storage of this data message for the scheduling FPGA.

As further described below, the FPGA that handles the storage of a data message stores the data message in a memory external to the data plane circuit. This FPGA is referred to as the storing FPGA in the discussion below, while the FPGA that implements the scheduler for a data message is referred to below as the scheduling FPGA. In some embodiments, the storing FPGA and scheduling FPGA are the same FPGA. In some of these embodiments, the data plane circuit selects the FPGA that is associated with the eventual destination egress port identified for the data message.

In other embodiments, the storing and scheduling FPGAs for a data message can be different FPGAs. For instance, in some of these embodiments, each ingress port is associated with one storing FPGA, while each eventual destination egress port is associated with one scheduling FPGA. In these embodiments, the ingress port specifies its associated FPGA for storing the data message, while the storing FPGA identifies the scheduling FPGA based on the egress port identified for the eventual destination of the data message. In other embodiments, the ingress pipeline selects the storing FPGA based on load balancing the data message flows across the FPGAs, as further described below.

When the ingress pipeline determines that a particular data message should be directed to a destination egress port scheduled by a particular FPGA, the ingress processing pipeline in some embodiments adds to metadata associated with this data message the egress port associated with the eventual destination of the data message, plus other metadata, such as a priority level for the data message, logical queue identifier, etc. In some embodiments, the ingress pipeline appends such metadata to a set of data tuples (called header vector) processed by the ingress and egress pipelines for this data message. In this header vector, the ingress pipeline also adds the egress port associated with the storing FPGA so that this data message can be forwarded to this egress port by the traffic manager.

In some embodiments, the ingress pipelines load balance the data messages stored in the external memories that serve as deep buffers for the data plane circuit. For instance, in some embodiments, an ingress pipeline computes a hash value from a set of attributes (e.g., a set of header values) associated with a particular data message, and uses this computed hash value to select an external memory (e.g., by using the hash value as an index to a lookup table that maps hash value ranges to external memory identifiers) to store the data message. This external memory is associated with the storing FPGA. Both the external memory and the storing FPGA are associated with a DP egress port. Accordingly, in some embodiments, the ingress pipeline appends to the data message's processed data tuple (1) the identifier for the DP egress port associated with the identified external memory's FPGA, and (2) the identifier for the eventual destination DP egress port for forwarding the data message through the network, as mentioned above.

The traffic manager then forwards the data message to the egress pipeline associated with the DP egress port corresponding to the FPGA of the identified external memory. Through this port, the FPGA then receives the data message and stores it in a storage queue in its associated external memory. This storage queue in some embodiments is based on metadata that the ingress pipeline specifies for the data message. As mentioned above, the FPGA that stores the data message in some embodiments may or may not be the scheduling FPGA for the data message. For instance, in some embodiments, the scheduling FPGA is the FPGA associated with the eventual destination DP egress port. In these embodiments, the storing FPGA identifies the scheduling FPGA by examining the identifier for the eventual destination DP egress port that it receives with the data message.

When the storing FPGA is also the scheduling FPGA, the FPGA determines when the data message should be redirected back to the data plane circuit, and when this time arrives, the FPGA in some embodiments retrieves the data message from its associated external memory and redirects it back to the appropriate ingress pipeline port. In some embodiments, the appropriate ingress pipeline port is a port associated with the FPGA. Some embodiments have one DP port associated with an FPGA, while other embodiments have multiple DP ports associated with an FPGA. Also, in some embodiments, the appropriate ingress port is the egress port from which the FPGA received the data message in the first place.

When the storing FPGA is different than the scheduling FPGA, the storing FPGA informs the scheduling FPGA that it has received a data message for the scheduling FPGA to schedule, and provides to the scheduling FPGA the metadata that it needs for this scheduling. Based on this metadata, the scheduling FPGA determines when the data message should be directed back to the data plane circuit. When this time arrives, the scheduling FPGA in some embodiments directs the storing FPGA to retrieve the data message from its external memory and to redirect it back to the ingress pipeline port associated with the storing FPGA.

In different embodiments, a scheduling FPGA differently directs another storing FPGA to redirect back to the data plane circuit the stored data message. For instance, in some embodiments, the scheduling FPGA provides the storing FPGA with a time identifier (e.g., a time stamp) that specifies the time at which the storing FPGA should redirect the data message back to the data plane circuit. In other embodiments, the scheduling FPGA directs the storing FPGA to redirect the data message back to the data plane circuit upon receiving the release instruction from the scheduling FPGA. In some embodiments, the storing FPGA appends metadata to the redirected data message that identifies any of the message processing stages that should be skipped for the redirected data message. In other embodiments, this determination is made statically based on the ingress port at which the redirected message is received.

The traffic manager (TM) in some embodiments stores a redirected (i.e., a recirculated) data message that the data plane receives from an FPGA in a TM egress queue that is associated with the eventual destination DP egress port that is scheduled by the FPGA. This TM egress queue in some embodiments is only scheduled by the scheduling FPGA for the DP egress port. As such, this TM egress queue should not experience any congestion that is not accounted for by the scheduling FPGA. In some embodiments, the traffic manager sends out the data messages from this TM egress queue on a first-in, first-out basis with no other delays introduced by the traffic manager. The traffic manager sends out these data messages along the egress pipeline associated with the eventual destination egress port.

One of ordinary skill in the art will realize that other embodiments implement the DP deep buffers differently. For instance, in some embodiments, the ingress pipelines determine whether to direct data messages to the TM buffers or to the deep buffers managed by the FPGAs based on other criteria (e.g., flow header values, etc.) than the eventual destination DP egress ports of the data messages. Some of these embodiments have the FPGAs or the data plane circuit (e.g., the ingress pipelines) associate the recirculated data messages with high-priority tags that direct the traffic manager to treat the recirculated data messages with the highest or one of the highest priorities in order to ensure that the recirculated data messages pass through the traffic manager buffers faster than all or most other data messages.

In some embodiments, all or several of the egress pipelines have egress ports connect to two or more of the storing FPGAs. Instead of sending a data message to an egress pipeline associated with a particular egress port corresponding to a particular storing FPGA, the ingress pipeline in some embodiments directs the data message to any one of several egress pipelines, which then provides the data message along one of its associated egress ports to the storing FPGA.

Some embodiments use one or more FPGAs and external memories associated with the FPGAs to implement large, hash-addressable tables for the data plane circuit. These embodiments configure at least one message processing stage of the DP circuit to store (1) a first plurality of records for matching with a set of data messages received by the DP circuit, and (2) a redirection record redirecting data messages that do not match the first plurality of records to a DP egress port associated with the memory circuit.

These embodiments configure an external memory circuit to store a larger, second set of records for matching with redirected data messages received through the DP egress port associated with the memory circuit. This external memory circuit is a hash-addressable memory in some embodiments. To determine whether a redirected data message matches a record in the second set of record, the method of some embodiments configures an FPGA associated with the hash-addressable external memory to use a collision free hash process to generate a collision-free, hash address value from a set of attributes of the data message. This hash address value specifies an address in the external memory for the record in the second set of records to compare with the redirected data message.

The records in the first and second set of records store sets of attributes that are to be compared with sets of attributes associated with the data messages. For instance, in some embodiments, the stored sets of attributes are potential header values (e.g., L2-L4 header values) that are to be compared with the header values of the received data messages. These header values in some embodiments are flow identifying values, such as a five-tuple identifier (i.e., source and destination IP addresses, source and destination ports, protocol). In some embodiments, the records in the first and second set of records are part of match records with associated actions. In some embodiments, each of the match records implicitly or explicit stores one or more parameters from which one or more actions or action records can be identified, as further described below.

The FPGA in some embodiments generates the hash address value for a redirected data message from the same set of message attributes that are used to compare with the attribute set stored by the record identified by the hash address value. Specifically, in some embodiments, each record in the second set of records stores a five-tuple identifier. In some of these embodiments, the FPGA computes a hash address value for a redirected data message by using the message's five tuple identifier to compute a hash function.

In some embodiments, the collision free hash process that the FPGA uses is a perfect hashing process. This hashing scheme uses one large primary table, and one or more smaller secondary tables. The primary and secondary tables are hash addressable, with the primary table using one hash function (called the primary hash function) and each secondary table using a different hash function (called the secondary table's hash function).

In some embodiments, the primary hash function is not a collision free hash function, while the secondary table's hash function is a collision free hash function for the records stored in the secondary table. In some embodiments, the primary table stores records that do not produce primary hash values (for the primary hash function) that collide with any other records in the primary table or any of the secondary tables. On the other hand, each secondary table in some of these embodiments stores a set of two or more records that produced colliding primary hash values, but do not produce colliding hash values when these hash values are computed with the hash function of the secondary table.

During the configuration of these tables, a control plane process in some embodiments stores one or more records in the primary and secondary tables. In some embodiments, the control plane process initially tries to store a record (called the processed record) in the primary table by (1) using the primary hash function to generate a primary hash value of the processed record's match identifier (i.e., the attribute set of the record that is used to match against the received data message attribute sets), and (2) determining whether the primary table already stores a previously processed record at the location identified by the primary hash value. The primary table might already store another record at this location because the primary hash function is not a collision free hash function.

When the primary table already does not store a previously processed record at the location identified by the primary hash value, the control plane process stores the processed record at the identified location. In some embodiments, each time the primary hash values produced for a set of two or more records collide in the primary table (i.e., identify the same record location in the primary table), the control plane process stores the colliding sets of records in a secondary table with a secondary hash function that does not produce colliding secondary hash values for the records in this set. At the colliding location in the primary table, the control plane process in some embodiments stores a reference to the secondary table plus parameters for identifying the secondary hash function (e.g., hash function parameters) for this secondary table.

For a set of N records that collide in the primary table, a secondary hash function might not result in the secondary hash values for the N records to collide. However, after identifying the next record (called the N+1 record) that collides with the other N records in the primary table, the control plane process might determine that the secondary hash value that this secondary hash function produces for this next record (i.e., the N+1 record) collides with a secondary hash value for one of the earlier processed N records.

In such a case, the control plane process selects for a new secondary hash function that produces N+1 non-colliding secondary hash values for the N+1 records. The control plane process in some embodiments then stores a new secondary table at a new location in the external memory and stores the N+1 records in this new secondary table at address locations identified by the new secondary hash function. It then updates the colliding location (e.g., the identified row) in the primary table with a new reference to the new secondary table and with new secondary hash function identifiers, and then releases the memory occupied by the old secondary table in the external memory circuit, which is no longer referenced by the primary table.

The following example illustrates the use of the primary and secondary tables during the data-plane's packet processing runtime. When the data plane receives a data message, the message is processed by one or more message processing stages of the data plane until it reaches a particular message processing stage that includes the match table that is supplemented by another table in the external memory. When this particular stage determines that the data message's attribute set (e.g., its five tuple identifier) does not match the match identifier of any of the records stored in its match table, this stage in some embodiment redirects the data message to the DP egress port associated with the memory circuit.

Through this DP egress port, the memory circuit's associated FPGA receives the data message. Using the primary hash function of the primary table, the FPGA then computes a hash address value from the data message's attribute set (e.g., its five-tuple identifier) and then determines whether this location stores a record that has an attribute set that matches the data message's attribute set. If so, the FPGA either performs the action associated with this record or sends a notification to the particular DP message processing stage (through a DP ingress port associated with the message processing pipeline that includes the particular message processing stage) of the action that the message processing stage has to perform.

On the other hand, when a record is stored at the hash addressed location in the primary table, but this record's attribute set does not match the data message's attribute set, the FPGA returns a no-match notification to the particular data plane message processing stage through the DP ingress port that is associated with the particular DP message processing stage. Alternatively, when the record stored at the hash addressed location in the primary table stores a reference to a secondary table along with an identifier for specifying this secondary table's hash function, the FPGA then uses this secondary table's hash function to compute a secondary hash value from the data message's attribute set, and then uses this secondary hash value to identify a location in the referenced secondary table.

The FPGA then determines whether this location in the secondary table stores a record that has an attribute set that matches the data message's attribute set. If so, the FPGA either performs the action associated with this record or sends a notification to the particular DP message processing stage (through the DP ingress port associated with the particular DP message processing stage) of the action that the message processing stage has to perform. On the other hand, when the identified record in the secondary table does not match the data message's attribute set, the FPGA returns a no-match notification to the particular data plane message processing stage through the DP ingress port that is associated with the particular DP message processing stage.

Some embodiments provide novel circuits for recording data messages received by a data plane circuit of a forwarding element in an external memory outside of the data plane circuit. The external memory in some embodiments is outside of the forwarding element. In some embodiments, the data plane circuit encapsulates the received data messages that should be recorded with encapsulation headers, inserts into these headers addresses that identify locations for storing these data messages in a memory external to the data plane circuit, and forwards these encapsulated data messages so that these messages can be stored in the external memory by another circuit. Instead of encapsulating received data messages for storage, the data plane circuit in some embodiments encapsulates copies of the received data messages for storage. Accordingly, in these embodiments, the data plane circuit makes copies of the data messages that it needs to record.

In some embodiments, the external memory that stores the forwarded data messages is the memory (e.g., the random access memory) of a computer connected to the forwarding element (e.g., a computer in the same network as the forwarding element, or a computer with a hardwired or wireless connection to the forwarding element). In some of these embodiments, the circuit that records the messages in the external memory is a network interface card (NIC) of the computer. This NIC in some embodiments can process Remote Data Memory Access (RDMA) requests and RDMA over Converged Ethernet (ROCE) encapsulation headers.

To record the data messages, three sets of message processing stages of the data plane circuit are configured to perform three different sets of operations. For instance, some embodiments configure (1) a first set of DP MAUs to identify a subset of data messages received by the data plane for recording in the external memory, (2) a second set of DP MAUs to specify external memory addresses to store the identified subset of data messages in the external memory, and (3) a third set of DP MAUs to specify encapsulation headers with the specified external memory addresses for encapsulating the identified subset of data messages, or copies of these data messages. The data plane circuit in some embodiments forwards the encapsulated data messages through one or more of its egress ports.

To configure the first MAU set, some embodiments store in the first MAU set, a set of one or more records to compare with sets of attributes of the received data messages, in order to identify the data messages that have sets of attributes that match at least one record. When more than one record is stored, the different records identify the different data message flows that should be stored in the external memory. In some embodiments, the first MAU set only samples some of the matching data messages, e.g., this set maintains a count for the data messages received for each matching flow and only samples the Nth data message (e.g., the $10^{th}$ data message) in each matching flow.

Some embodiments configure the second MAU set to generate different external memory addresses for successive data messages in a matching data message flow that should be recorded in the external memory. These different addresses specify different locations in the external memory for storing the successive data messages. The second MAU set in some embodiments generates the different external memory addresses by incrementing an address counter. In some embodiments, the external memory includes a circular buffer, and the address counter generates addresses for this circular buffer by resetting the generated address to a start of an address range after reaching an end of an address range.

In some embodiments, the first and second MAU sets are defined in one or more of the ingress processing pipelines, while the third MAU set is defined in one or more of the egress processing pipelines. Also, the first and second MAU sets overlap in some embodiments, while in other embodiments they do not have any MAU in common. As mentioned above, the third MAU set in some embodiments specifies an encapsulation header for a copy of a data message that is identified as a data message that should be stored in the external memory. This copy is generated by a duplicating circuit that in some embodiments is part of the ingress processing pipeline(s), while it is part of the traffic manager between the ingress and egress processing pipelines in other embodiments.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF DRAWINGS

The novel features of the invention are set forth in the appended claims. However, for purposes of explanation, several embodiments of the invention are set forth in the following figures.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments use one or more field programmable circuits to augment the functionality of a data plane circuit of a forwarding element that forwards data messages within a network. In several embodiments described below, the field programmable circuits are field programmable gate arrays (FPGAs), but one of ordinary skill will realize that in other embodiments the field programmable circuits are other types of circuits, such as microprocessors, micro controllers, etc.

In this document, data messages refer to a collection of bits in a particular format sent across a network. One of ordinary skill in the art will recognize that the term data message may be used herein to refer to various formatted collections of bits that may be sent across a network, such as Ethernet frames, IP packets, TCP segments, UDP datagrams, etc. Also, as used in this document, references to L2, L3, L4, and L7 layers (or layer 2, layer 3, layer 4, and layer 7) are references respectively to the second data link layer, the third network layer, the fourth transport layer, and the seventh application layer of the OSI (Open System Interconnection) layer model.

Some embodiments use several FPGAs and several external memories associated with the FPGAs to implement deep temporary-storage buffers for the data plane circuit. The FPGAs connect the data plane circuit with the external memories associated with the FPGAs, in order to temporarily store data messages received by the data plane circuit. In some of these embodiments, one or more of the FPGAs implement schedulers that specify when data messages should be retrieved from the external memories and provided back to the data plane circuit for forwarding through the network.

Figure 1:
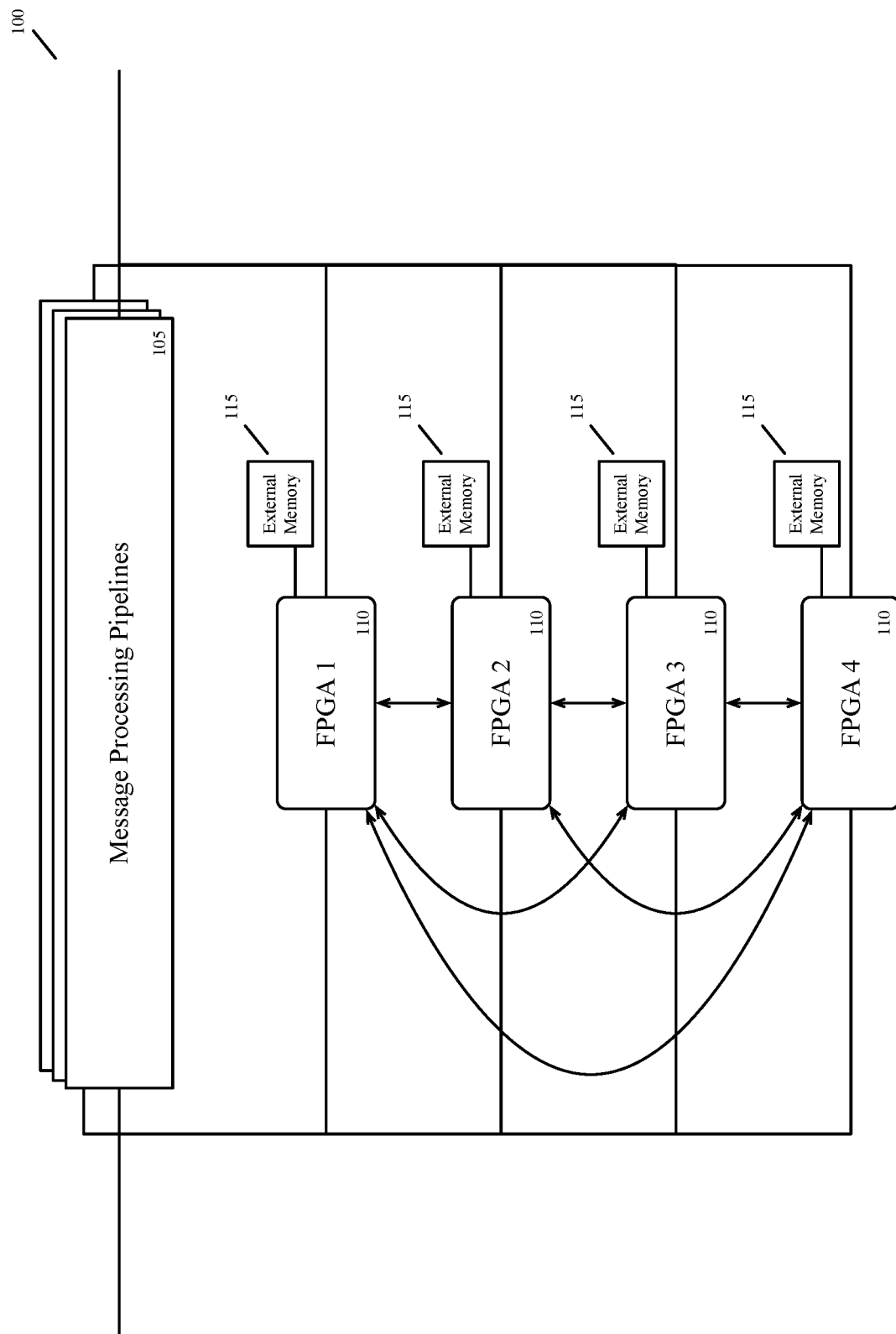
FIG. 1 illustrates an example of a data plane circuit of a forwarding element that uses FPGAs and external memories to implement deep buffers for storing data messages processed by its message processing pipelines.

FIG. 1 illustrates an example of a data plane circuit 100 of a forwarding element that uses FPGAs 110 and external memories 115 to implement deep buffers for storing data messages processed by its message processing pipelines. The data plane circuit 100 forwards data messages received by the forwarding network in a network. The data plane circuit 100 includes several message processing pipelines 105 to process data messages to determine how to forward the data messages in the network. In some embodiments, the message processing pipelines are implemented on an application specific integrated circuit (ASIC), while the FPGAs are implemented on one or more other ICs that are separate from this ASIC.

The FPGAs 110 connect the message processing pipelines 105 with the external memories 115 associated with the FPGAs. In some embodiments, an FPGA's associated external memory is on the same IC die as the FPGA, while in other embodiments, the associated external memory of the FPGA is on a different IC die or different chip than the FPGA. The external memories 115 serve as deep buffers for temporarily storing data messages that they receive from the message processing pipelines 105 through the FPGAs 110. Data plane (DP) circuits often store data messages that they process in temporary buffer storages for a variety of reasons, such as ensuring that they can process as many data messages as possible, and effectuating quality of service (QoS) policies that they are configured to implement.

In some embodiments, one or more of the FPGAs implement schedulers that specify when data messages should be retrieved from the external memories and provided back to the data plane circuit for forwarding through the network. For instance, in some embodiments, a particular FPGA can perform a scheduling operation for a first set of data messages stored in its associated external memory, while directing another FPGA to perform the scheduling operation for a second set of data messages stored in the particular FPGA's associated external memory.

Figure 2:
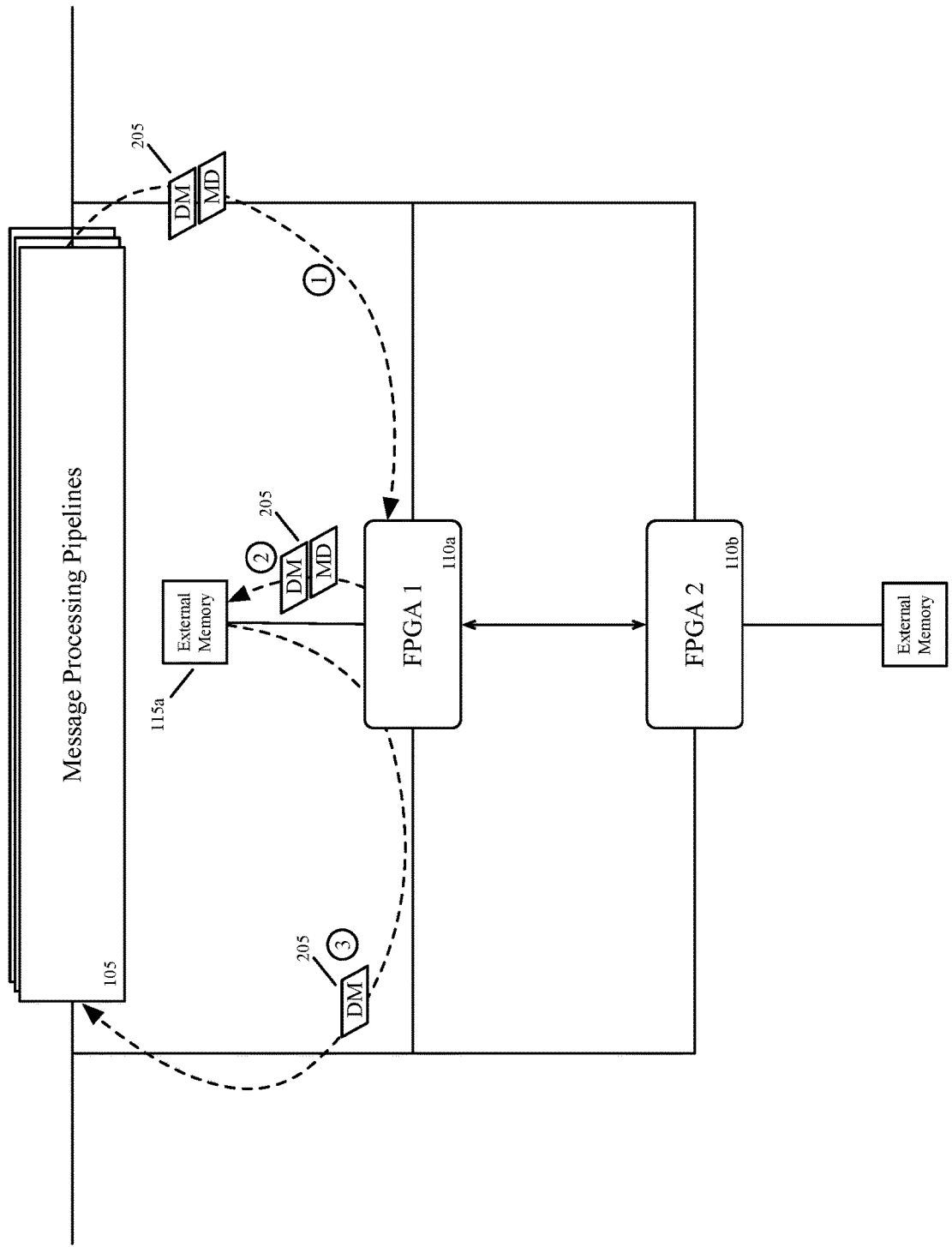
FIGS. 2 and 3 illustrate examples of one FPGA performing the scheduling for one data message received by the data plane circuit, while directing another FPGA to perform the scheduling for another data message flow received by the data plane circuit.
Figure 3:
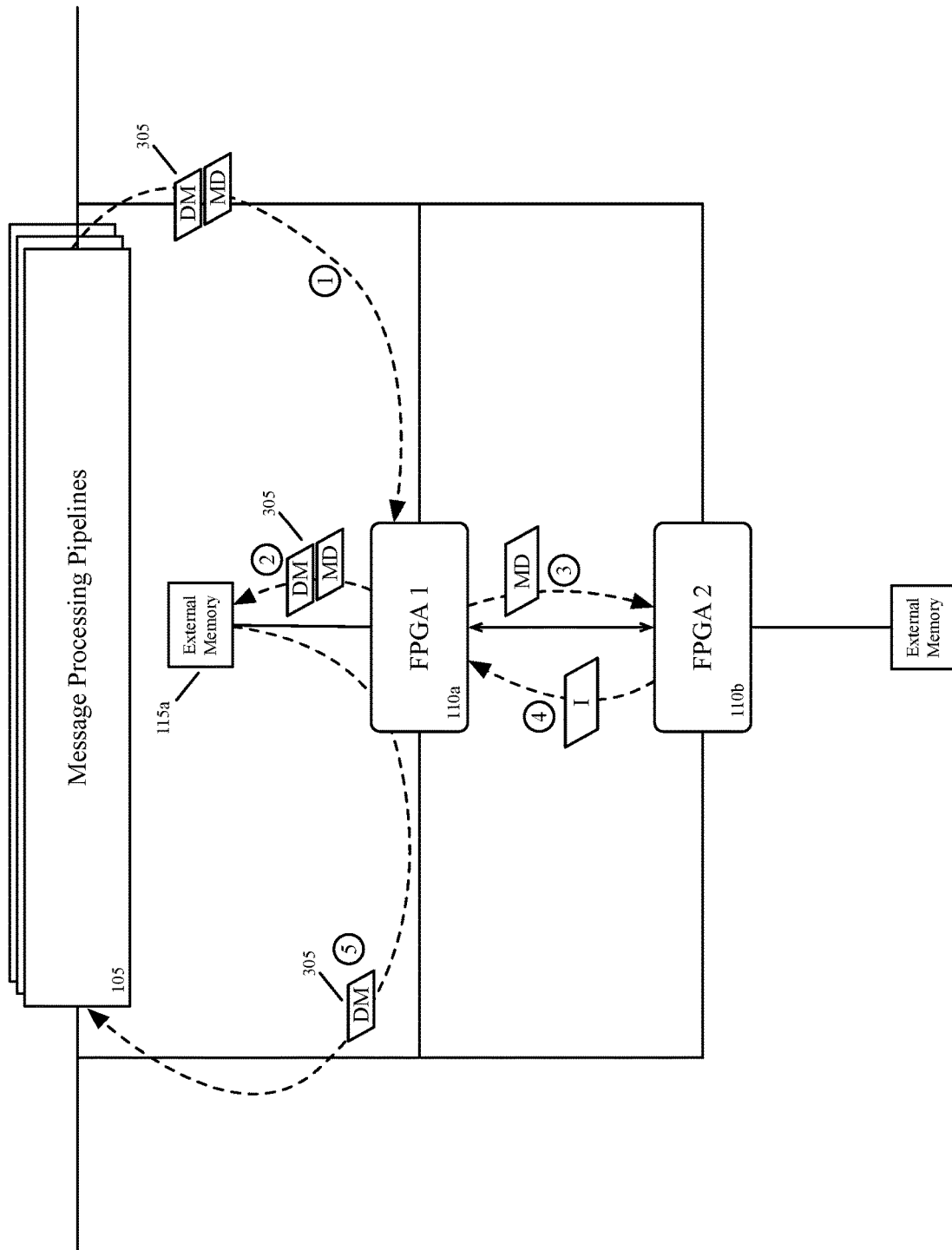

FIGS. 2 and 3 illustrate examples of one FPGA 110a performing the scheduling for one data message 205 received by the data plane circuit, while directing another FPGA 110b to perform the scheduling for another data message flow 305 received by the data plane circuit. Specifically, in this example, the FPGA 110a determines when a first data message 205 stored in its associated external memory 115a should be forwarded back to a message processing pipeline 105 for further processing to forward in a network, while directing the other FPGA 110b to determine when a second data message 305 stored in its external memory 115a should be forwarded back to a message processing pipeline 105.

FIG. 2 illustrates the FPGA 110a receiving the data message 205 from a message processing pipeline 105 and storing this data message in its associated external memory 115a. Along with the data message 205, the FPGA 110a receives metadata that the message processing pipeline 105 generated for the data messages. The received metadata in some embodiments includes a priority level and/or logical queue identifier for the data message, plus the eventual destination egress port to use to forward the data message through the network, etc. The logical queue identifier in some embodiments is used by the data plane circuit and the FPGAs to associate a priority level for a data message. In some embodiments, the FPGA 110a uses the received metadata to select a storage queue in the external memory 115a to store the data message 205 (e.g., to select a storage queue that the FPGA reads out at a particular rate and/or has a particular depth, etc.).

Based on the received metadata (e.g., the data plane egress port through which the data message must exist the data plane circuit to reach its destination in the network) or on other attributes of the received data message, the FPGA 110a determines that the received data message is one that it has to schedule. When the FPGA 110a has to schedule the recirculation of a data message back to the message processing pipeline, the FPGA 110a in some embodiments stores the data message in an external-memory storage queue that it reads out at a particular rate based on a configured rate that is associated with the storage queue. In some embodiments, the received data message's metadata specifies a priority level and/or logical queue identifier for the data message, and the FPGA 110a uses this priority level and/or logical queue identifier to select for this data message a storage queue that it reads out at a particular configured rate.

In other embodiments, the FPGA 110a stores the data message 205 in a storage queue of its external memory 115a at an address location that it can read out specifically when the FPGA 110a determines that it should redirect the data message back to a message processing pipeline 105. In some of these embodiments, the FPGA 110a performs a scheduling operation that specifies a time at which it should read out the data message 205 from its storage queue. FIG. 2 illustrates the FPGA 110a (1) retrieving the data message from the external memory 115a once this FPGA determines that the message should be forwarded to its destination by the data plane circuit, and (2) redirecting the data message for its forwarding to its destination.

FIG. 3 illustrates the FPGA 110a receiving another data message 305 from a message processing pipeline 105, along with metadata associated with this data message. Again, this FPGA stores the received data message in its associated external memory 115a. However, based on the received metadata (e.g., the data plane egress port through which the data message must exist the data plane circuit) or on other attributes of the received data message, the FPGA 110a determines that the received data message 305 is one that the FPGA 110b should schedule.

In some embodiments, the FPGA 110a stores the data message 305 in a storage queue of its external memory 115a at an address location that it can read out on demand when the FPGA 110b instructs it to redirect the data message back to the message processing pipeline 105. For the data message 305, the FPGA 110a provides some or all of its received metadata to FPGA 110b so that the FPGA 110b can use the metadata to perform its scheduling operation to determine when this data message should be redirected back to the data plane circuit. The provided metadata in some embodiments includes a priority level and/or logical queue identifier for the data message, the eventual destination egress port to use to forward the data message through the network, etc. FIG. 3 illustrates the FPGA 110b directing the FPGA110a to redirect the data messages 305 back to the data plane circuit, and the FPGA 110a (1) retrieving the data message from the external memory 115a, and (2) redirecting the data message back to a message processing pipeline to forward it to its destination.

In some embodiments, the data message that the FPGA 110a provides back to the data plane circuit 100 in the examples of FIGS. 2 and 3, is modified version of the data message that this FPGA receives from the data plane circuit 100. For instance, in some embodiments, the data message that is provided back to the data plane circuit 100 includes additional metadata, such as queue occupancy at enqueue time/dequeue time, etc.

Figure 4:
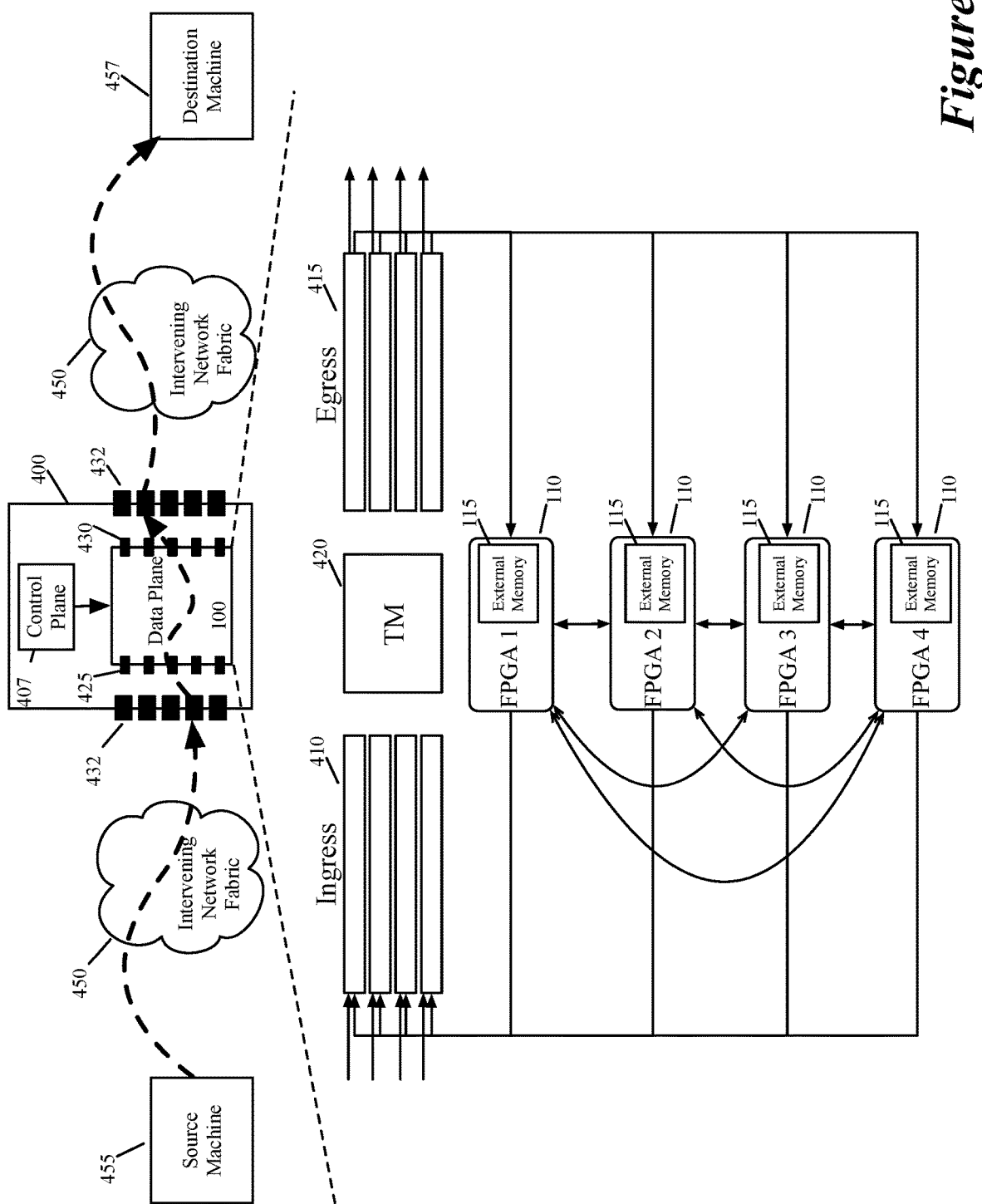
FIG. 4 illustrates a more detailed example of a forwarding element of some embodiments that includes FPGAs and external memories to augment the functionality of its data plane circuit.

FIG. 4 illustrates a more detailed example of a forwarding element of some embodiments that includes FPGAs 110 and external memories 115 to augment the functionality of its data plane circuit 100. In some embodiments, the external memories 115 serve as deep buffers for the data plane circuit 100, and the data plane circuit load balances across these external memories to store some or all of the data messages that it receives. Also, in some embodiments, different FPGAs of the forwarding element 400 implement the schedulers for different subsets of data messages that need to exit the data plane circuit through different egress ports.

FIG. 4 shows the forwarding element 400 as not only having a data plane circuit 100 but also including a control plane 407. To simplify the illustration, this figure also shows the external memories 115 within each FPGA, even though these memories can be on separate IC dies or chips in some embodiments. This figure also shows that the data plane circuit 100 in some embodiments includes ingress message processing pipelines 410, egress processing pipelines 415, a traffic manager 420, ingress ports 425 and egress ports 430. This figure further illustrates ingress/egress ports 432 of the forwarding element.

The forwarding element 400 forwards data messages within a network 450. The forwarding element 400 can be any type of forwarding element, such as a switch, a router, a bridge, etc. In FIG. 4, the forwarding element is deployed as a non-edge forwarding element (e.g., spine switch) in the interior of the network to forward data messages from a source device 455 to a destination device 457. In other cases, the forwarding element 400 is deployed as an edge forwarding element at the edge of the network to connect to compute devices (e.g., standalone or host computers) that serve as sources and destinations of the data messages. As a non-edge forwarding element, the forwarding element 400 forwards data messages between forwarding elements in the network (i.e., through intervening network fabric 450), while as an edge forwarding element, the forwarding element forwards data messages to and from edge compute devices to each other, to other edge forwarding elements and/or to non-edge forwarding elements.

The data plane circuit 100 (the "data plane") performs the forwarding operations of the forwarding element 400 to forward data messages received by the forwarding element to other devices. The control plane circuit 407 (the "control plane") configures the data plane circuit 100 in some embodiments. The ingress/egress ports 432 of the forwarding element receive data messages from, and transmit data messages to, devices outside of the forwarding element 400.

The data plane circuit 100 includes ingress ports 425 that receive data messages to process and egress ports 430 to transmit data messages after they have been processed. In some embodiments, one port can serve as both an ingress port 425 and an egress port 430. Some ports 425/430 of the data plane 100 are associated with the ingress/egress ports 432 of the forwarding element 400, while other ports 425/430 are associated with other circuits of the data plane 100 and the forwarding element 400. These other circuits include the FPGAs 110.

The traffic manager 420 in some embodiments serves as a crossbar switch that directs messages from the ingress pipelines to egress pipelines. In some embodiments, each ingress or egress message processing pipeline 410 or 415 includes several configurable (i.e., programmable) message-processing stages that can be configured to perform the data-plane forwarding operations of the forwarding element 400 to process and forward data messages to their destinations. These message-processing stages perform these forwarding operations by processing data tuples associated with data messages (e.g., header vectors derived from headers of the data messages) received by the data plane 100 in order to determine how to forward the messages.

Figure 5:
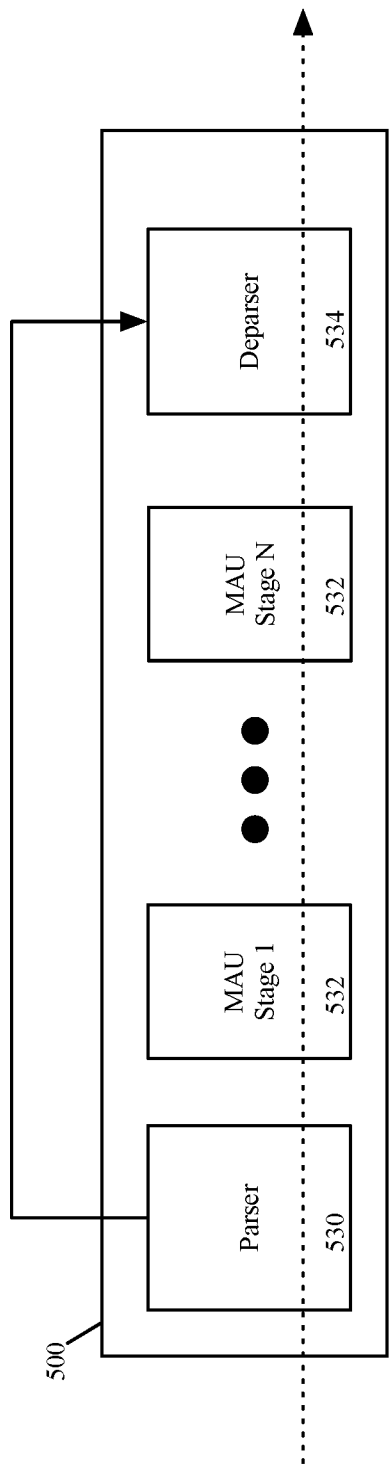
FIG. 5 illustrates an example of an ingress or egress message processing pipeline of some embodiments.

FIG. 5 illustrates an example of an ingress or egress message processing pipeline 500 of some embodiments. As shown, this pipeline includes several message-processing stages 532, which in some embodiments are match-action units (MAUs) that try to match data tuples (e.g., header vectors) of messages with table records that specify action to perform on the data tuples. In addition to the MAU stages, each ingress/egress pipeline in some embodiments includes a parser 530 and a deparser 534.

A pipeline's parser 530 extracts a message header from a data message that the pipeline receives for processing. In some embodiments, the extracted header is in a format of a header vector (HV) that is processed, and in some cases modified, by successive MAU stages 532 as part of their message processing operations. The parser 530 of a pipeline passes the payload of the message to the deparser 534 as the pipeline's message-processing stages 532 operate on the header vectors. In some embodiments, the parser also passes the message header to the deparser 534 along with the payload (i.e., the parser passes the entire message to the deparser).

When the pipeline 500 finishes processing a data message, the message has to be provided to the traffic management stage (in case of an ingress pipeline) or to a port 425 (in case of an egress pipeline) to be forwarded to the message's next hop (e.g., to its destination compute node or next forwarding element) or another circuit of the forwarding element (such as an FPGA). Accordingly, the deparser 534 of the pipeline in some embodiments produces the data message header from the message's header vector that was processed by the pipeline's last message processing stage, and combines this header with the data message's payload. In some embodiments, the deparser 534 uses part of the header received form the parser 530 to reconstitute the message from its associated header vector. When the data message is directed to an internal egress port associated with an FPGA, the deparser of an egress pipeline also appends metadata to this header (e.g., to the front of this header).

Figure 6:
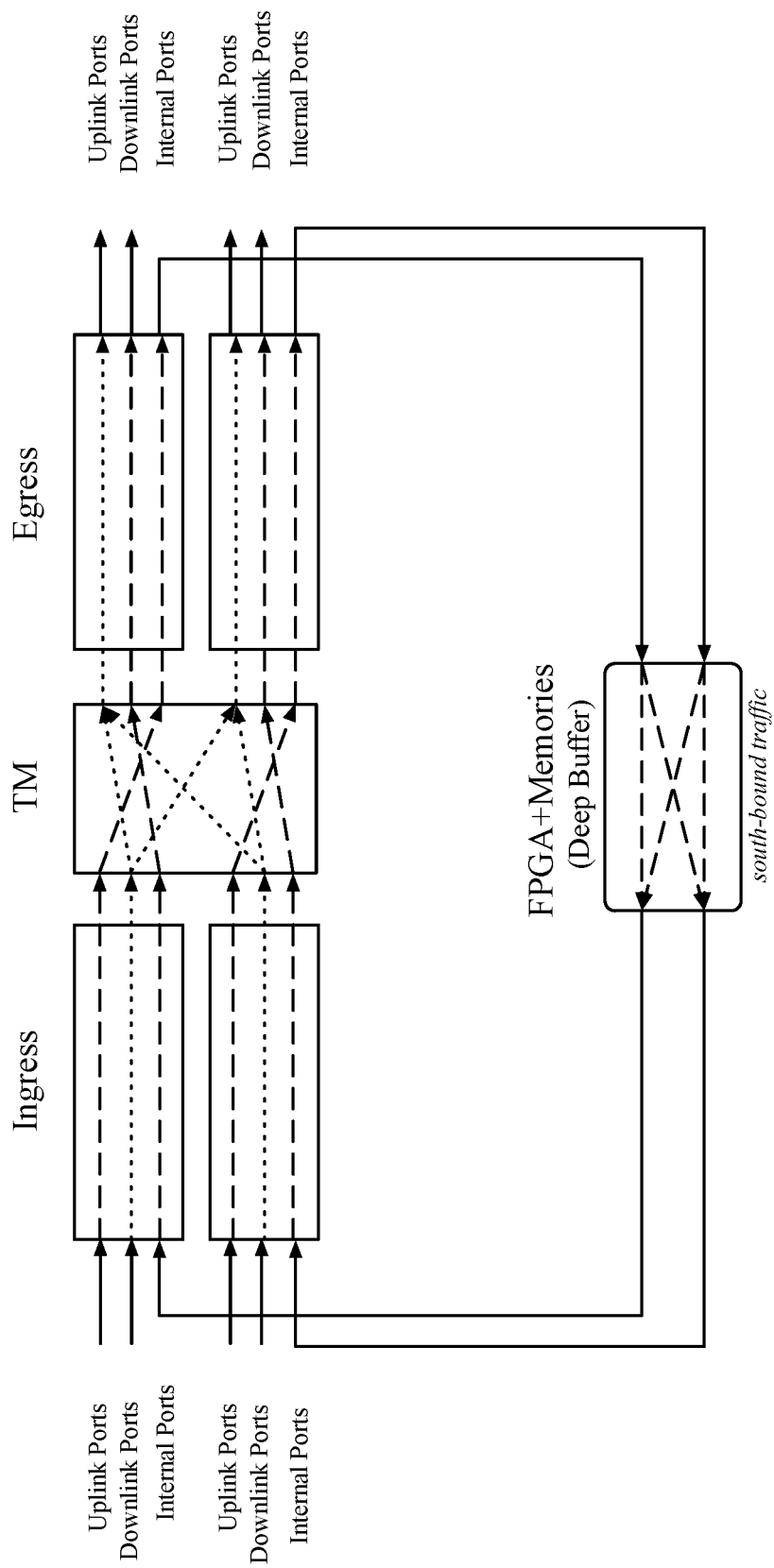
FIG. 6 illustrates an example of a data plane implementing the scheduler for data messages that should exit through a first set of egress ports, while the FPGAs implement the schedulers for data messages that should exit through a second set of egress ports of the data plane circuit.

In some embodiments, the data plane circuit implements the schedule for some of the egress ports, while different FPGAs 110 of the forwarding element 400 implement the schedulers for other egress ports. Specifically, in these embodiments, the traffic manager 420 implements the scheduler for data messages that should exit through a first set of egress ports 430 of the data plane circuit, while the FPGAs implement the schedulers for data messages that should exit through a second set of egress ports 430 of the data plane circuit. FIG. 6 illustrates one example of such an embodiment. In this example, the FPGAs schedule the data messages received through the downlink ports of a top-of-rack switch that uses the data plane 100 of some embodiments, while the traffic manager 420 implements the scheduler for the data messages received through the uplink ports of the data plane 100. The different FPGAs in some embodiments implement the schedulers for different subsets of data messages that need to exit the data plane circuit through different downlink egress ports.

Figure 7:
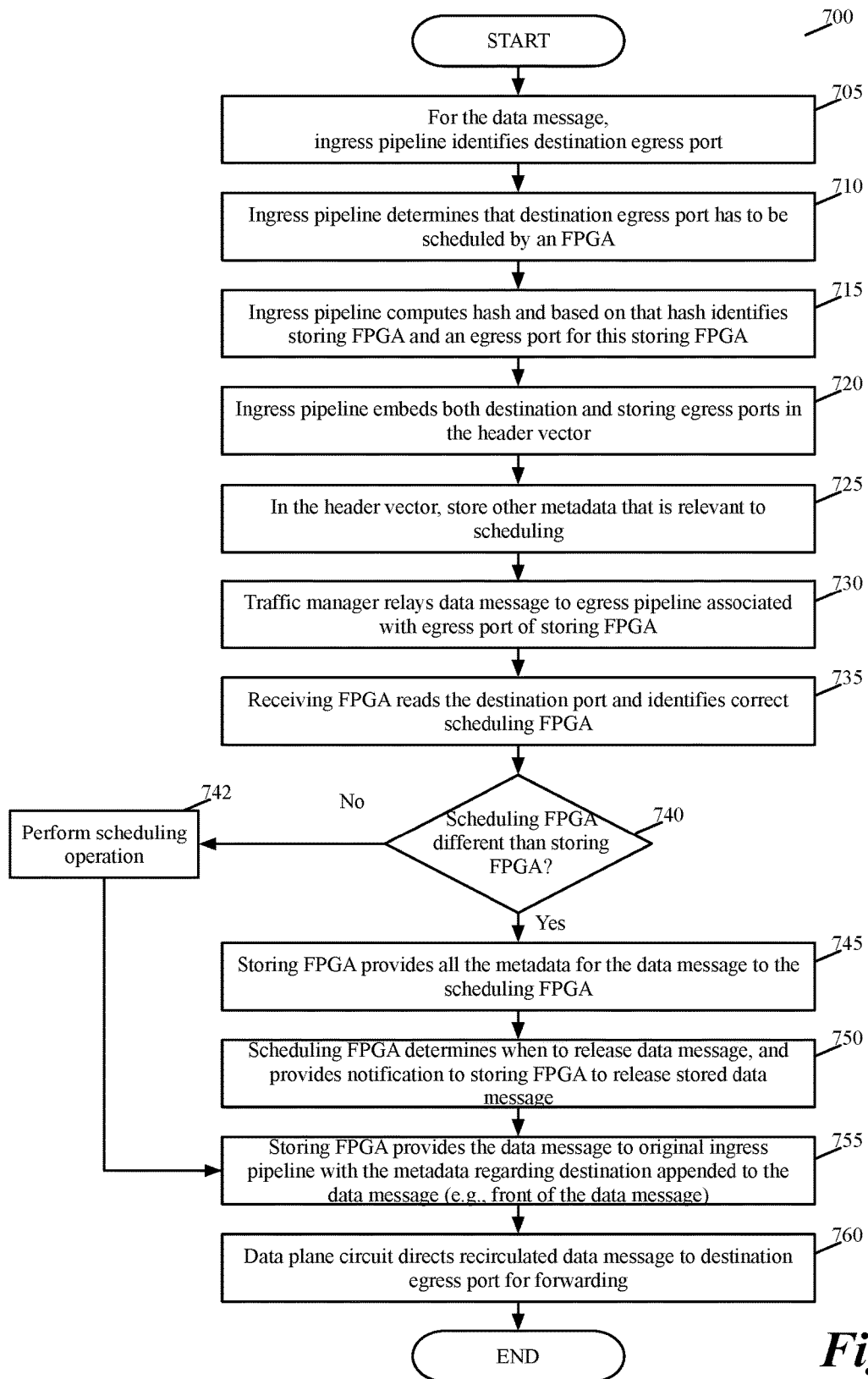
FIG. 7 presents a process that conceptually illustrates the operations of the data plane when it uses external memories and FPGAs to implements a deep buffer for its message processing pipelines.

FIG. 7 presents a process 700 that conceptually illustrates the operations of the data plane 100 when it uses external memories and FPGAs to implements a deep buffer for its message processing pipelines. These components perform this process for a data message that the data plane receives for forwarding in a network. The illustration in FIG. 7 is a conceptual one as some of the presented operations are performed in different orders in different embodiments.

As shown, an ingress processing pipeline 410 in some embodiments identifies (at 705) the DP egress port for forwarding the received data message to its destination in the network. As mentioned above, the traffic manager 400 schedules the data message egress for one set of DP egress ports 430 (e.g., the uplink ports), while the FPGAs implement the schedulers for the data message egress of another set of DP egress ports 430 (e.g., the downlink ports). In the example illustrated by the process 700, the ingress pipeline determines (at 710) that the DP egress port identified at 705 is scheduled by a particular FPGA.

In some embodiments, the ingress pipelines load balance the data messages stored in the external memories that serve as deep buffers for the data plane circuit. Accordingly, in some embodiments, the ingress pipeline computes (at 715) a hash value from a set of attributes (e.g., a set of header values) associated with a particular data message, and uses this computed hash value to select an external memory (e.g., by using the hash value as an index to a lookup table that maps hash value ranges to external memory identifiers) to store the data message. This external memory is associated with an FPGA, which is referred to below as storing FPGA. Both the external memory and the storing FPGA are associated with a DP egress port.

Next, at 720, the ingress pipeline in some embodiments specifies two egress ports 430 for this data message, one that is the eventual egress port from which the data message should exit the data plane circuit, and another that is the egress port for forwarding the data message to an FPGA that will store the data message in its associated external memory. For instance, in some embodiments, the ingress pipeline stores (at 720) in the data message's processed header vector (1) the identifier for the DP egress port associated with the identified external memory's FPGA, and (2) the identifier for the eventual destination DP egress port for forwarding the data message through the network. Each of these egress ports is associated with an egress pipeline. In some cases, the two egress ports can be associated with the same egress pipeline 415, or they can be associated with two different egress pipelines.

Next, at 725, the ingress pipeline stores in the header vector other metadata that would be relevant to the scheduling of the data message. One example of such metadata is the priority level and/or logical queue identifier associated with the data message. Other embodiments include additional metadata in the data message's processed header vector, such as the eventual destination egress port to use to forward the data message through the network, etc.

When the ingress pipeline 410 determines that a particular data message should be directed to a destination egress port scheduled by the traffic manager 420, the traffic manager 420 temporarily stores the data message in its set of buffers until such time that the traffic manager determines that the data messages should be forwarded to the egress pipeline associated with the destination egress port identified by the ingress pipeline. On the other hand, when the ingress pipeline 410 determines that a particular data message should be directed to a destination egress port scheduled by a particular FPGA, the traffic manager 420 directs (at 730) the particular data message to an egress pipeline 415 associated with the DP egress port 430 associated with the particular FPGA.

In doing so, the traffic manager in some embodiments stores the data message in its set of buffers, but it does not impose any extra delay before releasing the data message to the FGPA's associated egress pipeline in order to enforce some of its own scheduling constraints (e.g., its own QoS constraints). In some embodiments, the traffic manager has ingress and egress queues, and some of these queues are associated with the FPGAs and their associated DP egress ports. In these embodiments, the traffic manager stores the data message in the ingress queue and/or egress queue associated with the DP egress port identified at 715 for the identified FPGA.

Once the traffic manager forwards the data message to the egress pipeline associated with the DP egress port identified at 715 for the identified storing FPGA, the egress pipeline forwards the data message to this DP egress port. Through this port, the FPGA then receives (at 735) the data message and stores it in its associated external memory. This storage (e.g., the queues used to store the data message) in some embodiments is based on metadata that the ingress pipeline specifies for the data message. For instance, in some embodiments, the storing FPGA 110 uses the received metadata to select a storage queue in its external memory 115 to store the data message The storing FPGA in some embodiments may or may not be the scheduling FPGA for the data message. Accordingly, after receiving the data message, the storing FPGA uses (at 735) the eventual destination DP egress port identified in the metadata that it receives with the data message (i.e., uses the identifier for the eventual destination DP egress port in the metadata), in order to identify the scheduling FPGA for the data message. In other embodiments, the storing FPGA identifies the scheduling FPGA through other mechanisms (e.g., by performing a hash lookup based on the data message's five-tuple identifier).

At 740, the storing FPGA determines whether another FPGA is the scheduling FPGA based on the identification at 735. If not, the storing FPGA 110 schedules (at 742) the recirculation of a data message back to the data plane circuit, and then transitions to 755, which will be described below. To schedule the recirculation of the data message, the storing FPGA in some embodiments stores the data message in an external-memory storage queue that it reads out at a particular rate based on a configured rate that is associated with the storage queue.

In some embodiments, the received data message's metadata specifies a priority level and/or logical queue identifier for the data message, and the storing/scheduling FPGA 110 uses this priority level and/or logical queue identifier to select for this data message a storage queue that it reads out at a particular configured rate. In other embodiments, the storing/scheduling FPGA 110 stores the data message in a storage queue of its external memory 115 at an address location that it can read out specifically when the storing/scheduling FPGA 110 determines that it should redirect the data message back to the data plane circuit 105. In some of these embodiments, the FPGA 110 performs a scheduling operation that specifies a time at which it should read out the data message from its storage queue.

On the other hand, when the storing FPGA is different than the scheduling FPGA, the storing FPGA informs (at 745) the scheduling FPGA that it has received a data message for the scheduling FPGA to schedule, and provides to the scheduling FPGA the metadata that it needs for this scheduling. The provided metadata in some embodiments includes a priority level and/or logical queue identifier for the data message, etc. Based on this metadata, the scheduling FPGA determines (750) when the data message should be directed back to the data plane circuit. When this time arrives, the scheduling FPGA in some embodiments directs (at 750) the storing FPGA to retrieve the data message from the external memory and to redirect it back to the ingress pipeline port associated with the storing FPGA, and then transitions to 755, which will be described below.

In different embodiments, the scheduling FPGA differently directs the storing FPGA to redirect back to the data plane circuit the stored data message. For instance, in some embodiments, the scheduling FPGA provides the storing FPGA with a time identifier (e.g., a time stamp) that specifies the time at which the storing FPGA should redirect the data message back to the data plane circuit. In other embodiments, the scheduling FPGA directs the storing FPGA to redirect the data message back to the data plane circuit upon receiving the release instruction from the scheduling FPGA.

At 755, the storing FPGA determines on its own (when it is both the storing/scheduling FPGA) that it should redirect the data message to the data plane circuit, or receives notification from another FPGA (when the other FPGA is the scheduling FPGA) that is should redirect the data message back to the data plane circuit. Accordingly, at 755, the storing FPGA retrieves the data message from its associated external memory and redirects it back to one of the ingress pipeline ports.

In some embodiments, this ingress pipeline port is the port associated with the FPGA. Some embodiments have one DP port associated with an FPGA, while other embodiments have multiple DP ports associated with an FPGA. Also, in some embodiments, the appropriate ingress port is the egress port from which the FPGA received the data message in the first place. In some embodiments, the storing FPGA provides the data message to the ingress port that is associated with the original ingress pipeline that processed the data message before it was directed to the storing FPGA. In some of these embodiments, the storing FPGA identifies this ingress pipeline based on metadata that it received with the data message.

In some embodiments, the storing FPGA appends metadata to the redirected data message. This metadata includes the eventual destination DP egress port in some embodiments. In other embodiments, the storing FPGA inserts this egress port as the destination egress port of the recirculated data message. The appended metadata in some embodiments also identifies the message processing stages should be skipped (e.g., by identifying a number of ingress processing stages that should be skipped, or identifying the first ingress processing stage that should be performed) for the redirected data message. In other embodiments, the ingress pipeline that gets the redirected data message makes this determination statically based on the ingress port at which it received the data message. The appended metadata in some embodiments also includes other metadata, such as queue occupancy at enqueue time/dequeue time, etc.

At 760, the ingress pipeline, associated with the ingress port that receives the recirculated data message, forwards the data message to the traffic manager. The traffic manager in some embodiments stores (at 760) the redirected (i.e., the recirculated) data message that the data plane receives from the storing FPGA in a TM egress queue that is associated with the eventual destination DP egress port that is scheduled by the FPGA. This TM egress queue in some embodiments is only scheduled by the scheduling FPGA for the DP egress port. As such, this TM egress queue should not experience any congestion that is not accounted for by the scheduling FPGA. In some embodiments, the traffic manager sends out the data messages from this TM egress queue on a first-in, first-out basis with no other delays introduced by the traffic manager. The traffic manager sends out these data messages along the egress pipeline associated with the eventual destination egress port. The egress pipeline then provides the data message to the egress port, which then forwards it along the network.

One of ordinary skill in the art will realize that other embodiments implement the DP deep buffers differently with the FPGAs and the external memories. For instance, in some embodiments, the ingress pipelines determine whether to direct data messages to the TM buffers or to the deep buffers managed by the FPGAs based on other criteria (e.g., flow header values, etc.) than the eventual destination DP egress ports of the data messages. Some of these embodiments have the FPGAs or the data plane circuit (e.g., the ingress pipelines) associate the recirculated data messages with high-priority tags that direct the traffic manager to treat the recirculated data messages with the highest or one of the highest priorities in order to ensure that the recirculated data messages pass through the traffic manager buffers faster than all or most other data messages.

Also, the ingress pipelines in some embodiments do not load balance the data messages stored in the external memories. For instance, in some embodiments, one FPGA performs both the storing and scheduling operations for a data message flow. For a data message that is part of this flow, the ingress pipeline in some embodiments directs the data messages to an FPGA to perform both the storing and scheduling operations. In other embodiments, the storing and scheduling FPGA can be different for a data message flow. In some such embodiments, an ingress pipeline maps specifies the storing FPGA for the data message flow, while the scheduling FPGA is identified (e.g., by the ingress pipeline, an egress pipeline or the storing FPGA) from the egress port associated with the eventual destination of the data message flow (where this egress port is identified by the ingress pipeline in some of these embodiments).

In some embodiments, all or several of the egress pipelines have egress ports connect to two or more of the storing FPGAs. Instead of sending a data message to an egress pipeline associated with a particular egress port corresponding to a particular storing FPGA, the ingress pipeline can direct the data message to any one of several egress pipelines, which then provides the data message along one of its associated egress ports to the storing FPGA.

Some embodiments use one or more FPGAs and external memories associated with the FPGAs to implement large, hash-addressable tables for the data plane circuit. These embodiments configure at least one message processing stage of the DP circuit to store (1) a first set of records for matching with a set of data messages received by the DP circuit, and (2) a redirection record redirecting data messages that do not match the first plurality of records to a DP egress port associated with the memory circuit. These embodiments configure an external memory circuit to store a larger, second set of records for matching with redirected data messages received through the DP egress port associated with the memory circuit.

Figure 8:
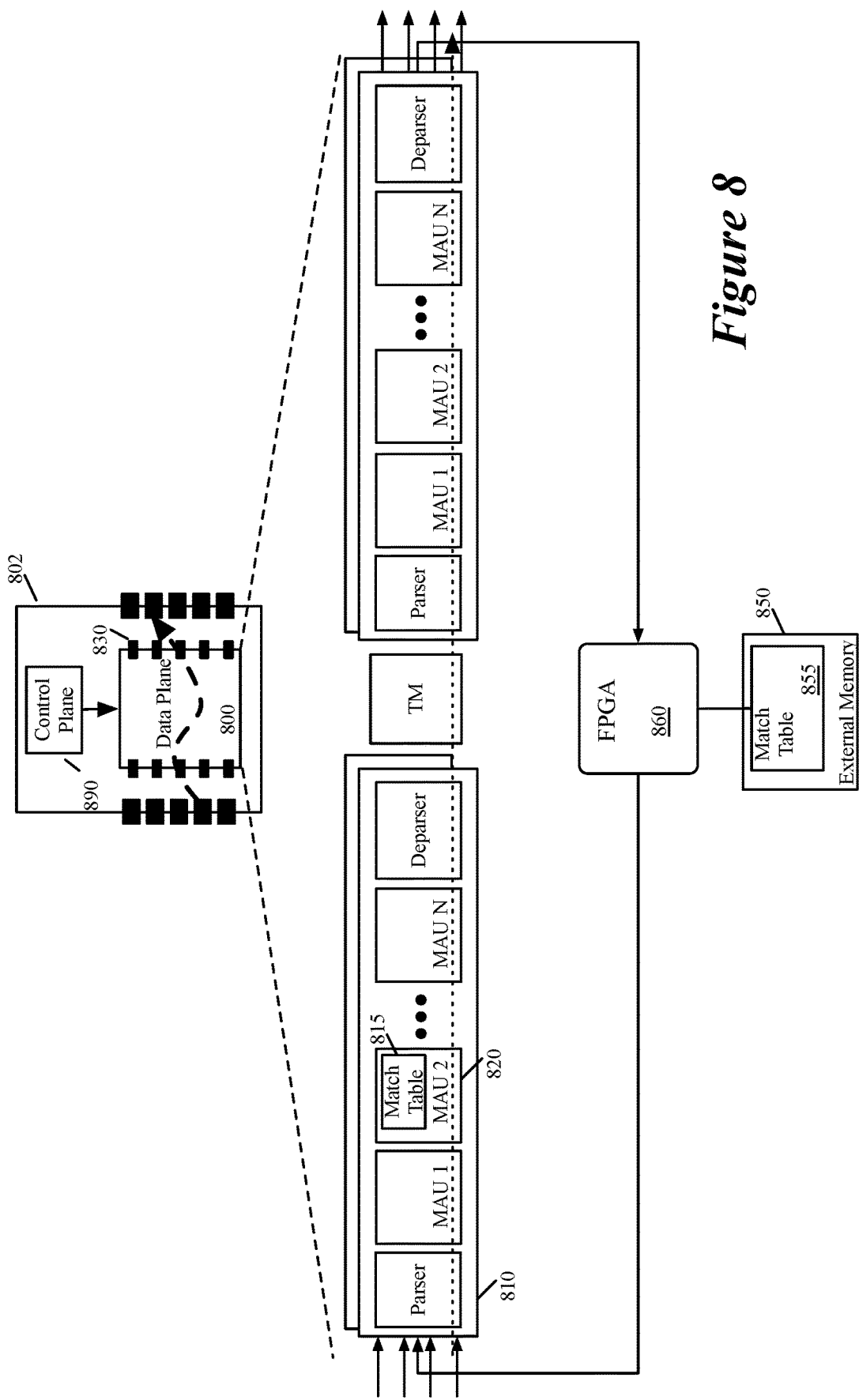
FIG. 8 illustrates an example of a data plane that uses one or more FPGAs and external memories associated with the FPGAs to implement large, hash-addressable tables.

FIG. 8 illustrates an example of the data plane 800 of some such embodiments. In this example, the data plane 800 of a forwarding element 802 uses an external memory 850 to store a large match table 855 that supplements a smaller match table 815 of a match-action unit 820 in an ingress pipeline 810 of the data plane 800. For instance, the external memory's larger match table in some embodiments stores 100 or 1000 times more records than the smaller match table of the MAU 820. In this example, when a data message does not match any record in the smaller table 815, the MAU 820 sets a set of parameters in the data message's processed header vector (1) that direct all the subsequent MAU stages to skip processing this data message, and (2) that directs the traffic manager to direct the data message to a DP egress port 830 associated with an FPGA 860 that serves as an interface between the data plane's message processing stages and the external memory 850.

In some embodiments, each record in the smaller or larger match table 815 or 855 is associated with a corresponding action. For instance, in some embodiments, each record in the smaller or larger match table explicitly identifies (e.g., includes a reference to) or implicitly identifies (e.g., has its location in the match table identify) a corresponding record in an action table. When a data message matches the match criteria of a match record in the smaller or larger match table, the MAU 820 or FPGA 860 performs the action specified by the corresponding action record on the data message.

Figure 9:
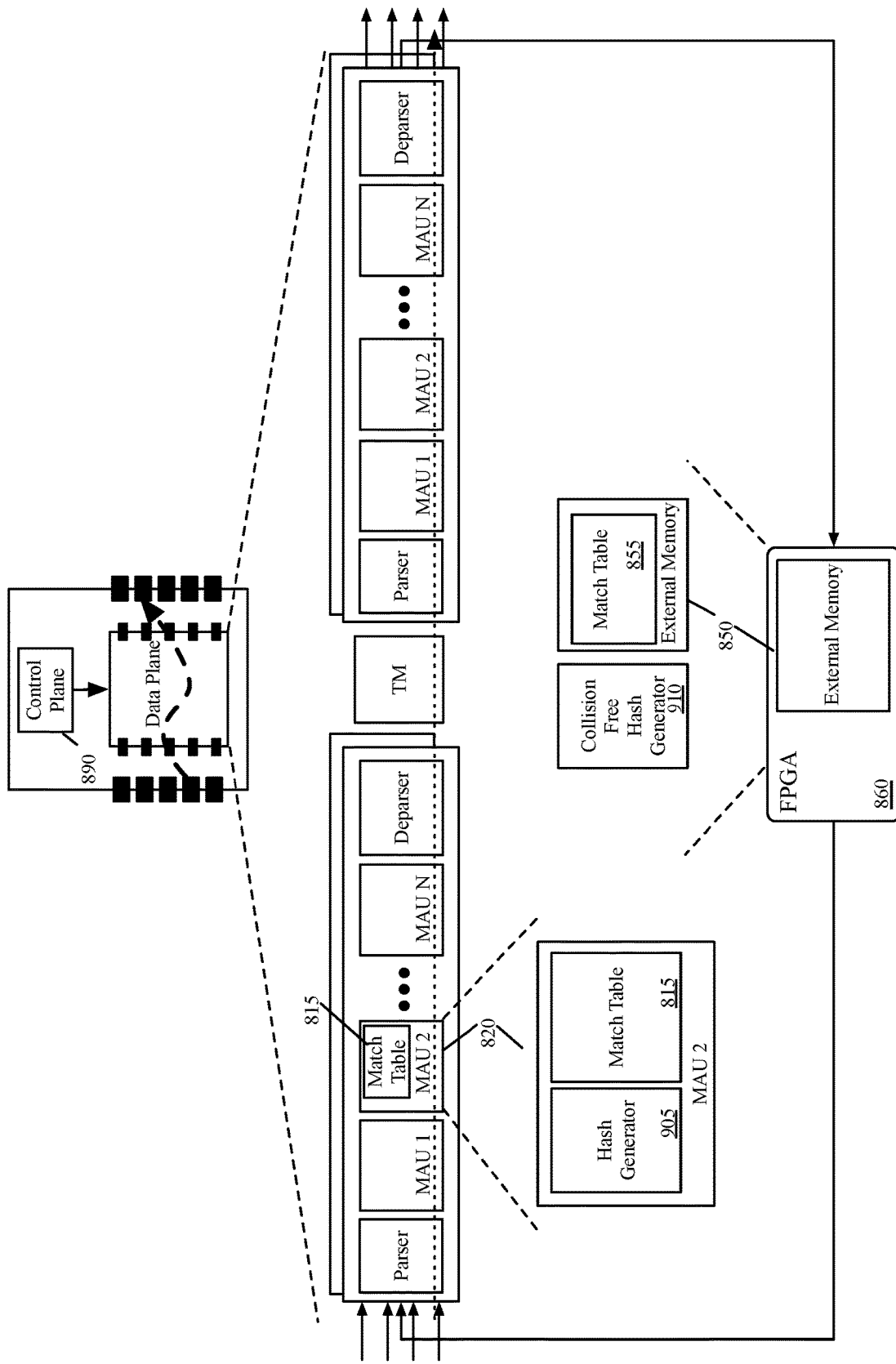
FIG. 9 illustrates that in some embodiments the match tables are hash-addressable memories.

FIG. 9 illustrates that in some embodiments both the smaller and larger match tables 815 and 855 are hash-addressable memories. In this figure, the external memory 850 is drawn inside the FPGA to simplify the illustration, even though the external memory can be on a separate IC than the FPGA in some embodiments. In this example, the MAU 820 determines whether the data message matches a record in the smaller match table 815, by using a hash generator 905 to generate a hash address value from the data message's attribute set and determining whether the smaller match table stores an attribute set at the generated hash address value that matches the data message's attribute set.

In some embodiments, the MAU's hash generator 905 is not a collision free hash generator, and hence it may generate hash address values for different data messages that identify the same record in the smaller table 815. Also, in some embodiments, the smaller match table 815 includes multiple (e.g., four sub-tables), and the generated hash address value identifies multiple records in these multiple sub-tables. In these embodiments, the MAU 820 determines whether the data message matches any of the identified records in these sub-tables.

To determine whether a redirected data message matches one of the records in the larger match table 855, the FPGA uses a collision free hash generator 910 to generate a collision-free, hash address value from a set of attributes of the redirected data message. This hash address value specifies the location of the record in the larger match table 855 to compare with the attribute set of the redirected data message. This hash value is collision free as each record in the larger match table can be identified by a unique hash value or a unique set of hash values (e.g., a hash value range) that does not collide with the hash value of any other record in the larger match table.

In some embodiments, the records in the smaller and larger match tables 815 and 855 store sets of attributes that are to be compared with sets of attributes associated with the data messages. For instance, in some embodiments, the stored sets of attributes are potential header values (e.g., L2-L4 header values) that are to be compared with the header values of the received data messages. These header values in some embodiments are flow identifying values, such as a five-tuple identifier (i.e., source and destination IP addresses, source and destination ports, protocol).

The MAU 820 and the FPGA 860 in some embodiments generate the hash address values for the data message from the same set of message attributes that are used to compare with the attribute sets stored by the records identified by the hash address values. Specifically, in some embodiments, each record in either the smaller table 815 or the larger table 855 stores a five-tuple identifier. In some of these embodiments, the MAU 820 or the FPGA 860 computes a hash address value for a data message by using the message's five tuple identifier to compute a hash function.

Figure 10:
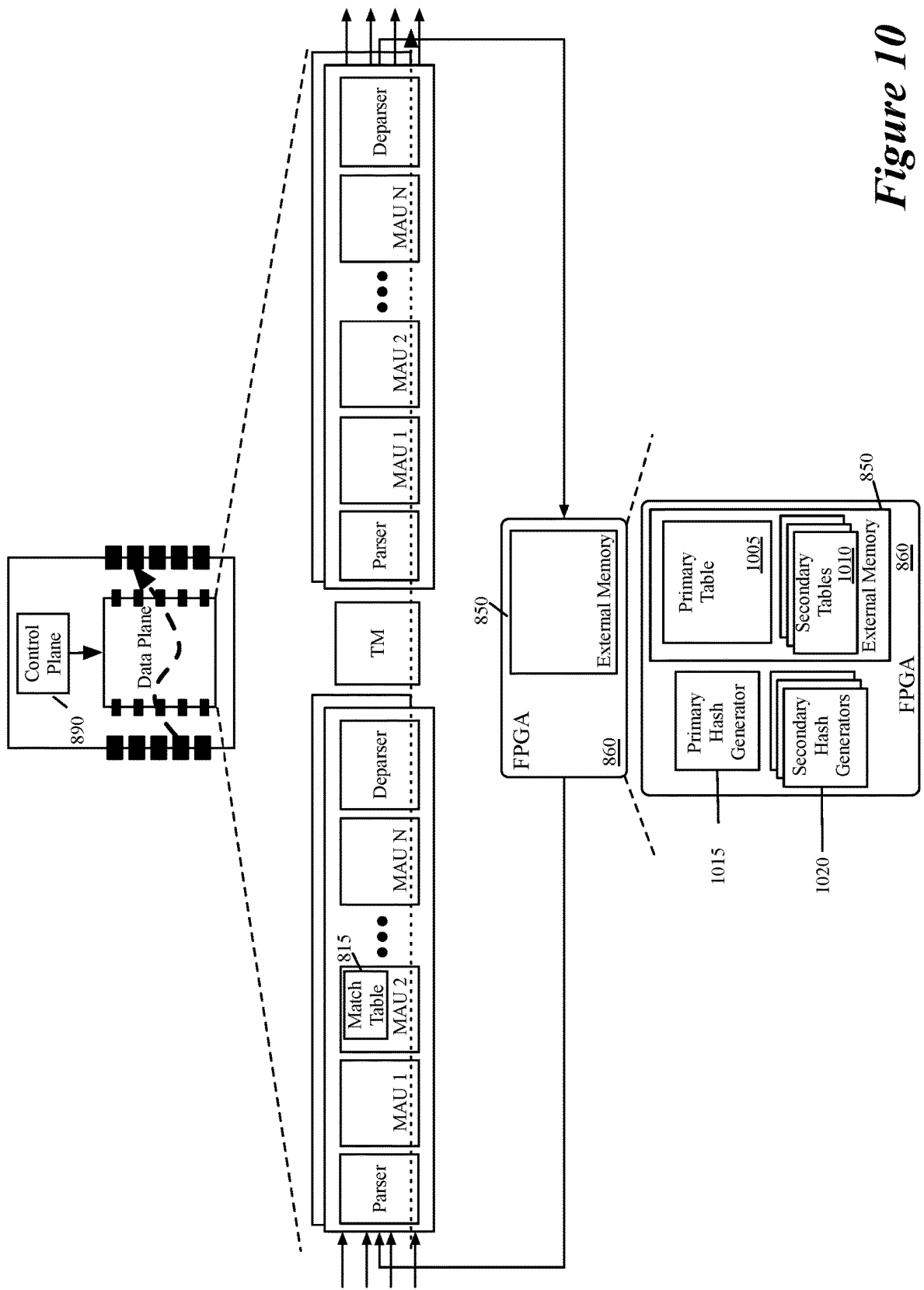
FIG. 10 illustrates how an FPGA in some embodiments implements this perfect hashing process.

In some embodiments, the collision free hash process that the FPGA uses is a perfect hashing process that implements the larger match table 855 with two sets of tables, which are a primary table and one or more secondary tables. FIG. 10 illustrates how the FPGA 860 in some embodiments implements this perfect hashing process. As shown, the FPGA 860 implements this process by using one large primary table 1005, and one or more smaller secondary tables 1010. The primary and secondary tables 1005 and 1010 are hash addressable, with the primary table using one hash generator 1015 (called the primary hash generator in the discussion below) and each secondary table using a different hash generator 1020 (called the secondary table's hash generator).

In some embodiments, the primary hash generator 1015 of the primary table 1005 is not a collision free hash generator, while the secondary hash generator 1020 of each secondary table 1010 is a collision free hash generator for the records stored in the secondary table. For instance, in some embodiments, the primary table 1005 stores records that do not produce primary hash values (for the primary hash function of the primary hash generator 1015) that collide with any other records in the primary table or any of the secondary tables. On the other hand, each secondary table 1010 in some of these embodiments stores a set of two or more records that collided in the primary table 1005 (i.e., produced colliding primary hash values), but do not collide in the secondary table (i.e., do not produce colliding hash values when these hash values are computed by using the secondary hash generator of the secondary table).

Figure 11:
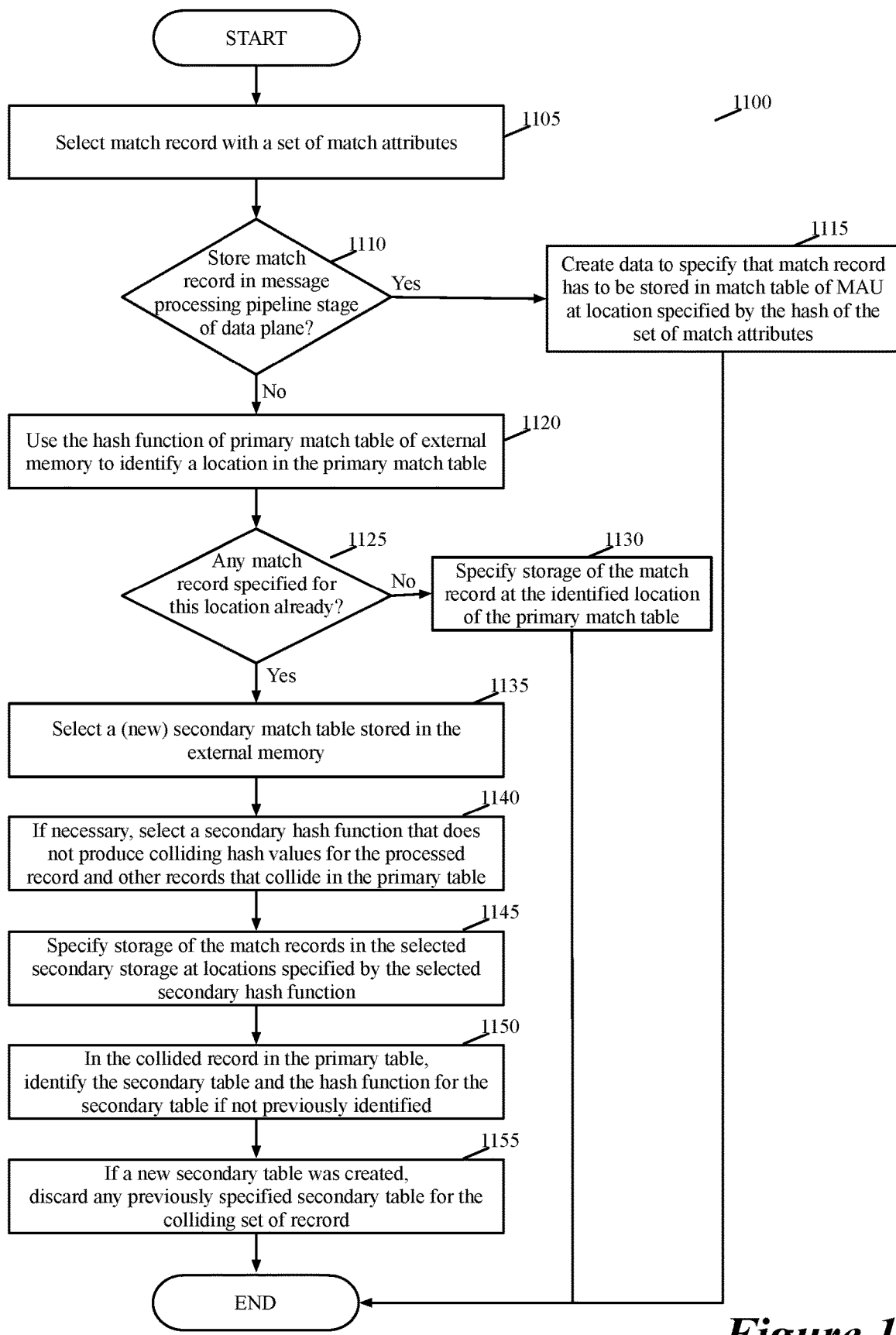
FIG. 11 illustrates a process that the control plane performs in some embodiments to specify the configuration data for storing a match-table record in one of these tables.

In some embodiments, the control plane 890 illustrated in FIGS. 8-10 configures the MAU table 815, the primary table 1005 and the secondary tables 1010 to store the match table records. In other embodiments, a remote control plane (i.e., a control plane executing outside of the forwarding element 802) configures these tables. FIG. 11 illustrates a process 1100 that the control plane (CP) performs in some embodiments to specify the configuration data for storing a match-table record in one of these tables. As shown, the CP process 1100 initially selects (at 1105) a match-table record (called the processed record) that includes a match attribute set to compare with the attribute set of the data messages processed by the data plane. In some embodiments, the match-table record has an accompanying action identifier or action-table record that specifies the action that the data plane has to perform when a data message's attribute set matches the match-table record's match attribute set.

Next, at 1110, the CP process 1100 determines whether it should store the selected match-table record in a particular MAU stage. If so, the process creates (at 1115) data for a configuration file to specify that the match-table record should be stored in the particular MAU stage at a location specified by a hash value address generated by applying a hash function to the match attribute set of the match record. After 1115, the process ends.

On the other hand, when the CP process 1100 determines (at 1110) that the selected match-table record should not be stored in the particular MAU stage, the CP process initially tries to store the processed record in the primary table by (1) using a primary-table hash function to generate a primary hash value of the processed record's match identifier (i.e., the attribute set of the record that is used to match against the received data message attribute sets), and (2) determining whether the primary table 1005 already stores a previously processed record or a reference to a secondary table at the location identified by the primary-table hash value. The primary table might already store another record at this location because the primary hash function is not a collision free hash function.

Specifically, when the CP process 1100 determines (at 1110) that the selected match-table record should not be stored in the particular MAU stage, the CP process uses (at 1120) the primary-table hash function to compute a hash value address for this table. In some embodiments, the hash function for the primary table is the same hash function as the MAU table, but given that the MAU table is smaller, a smaller portion of the hash value addresses generated for the MAU table are used to identify locations in the MAU table. In other embodiments, different hash functions are used for the MAU table 815 and the primary table 1005.

The process 1100 then determines (at 1125) whether it has previously identified this location for any other match-table record that are currently stored in the primary table 1005 or one of the secondary tables 1010. When the process determines that it has not previously identified this location for any other match-table record, the control plane process 1100 generates (at 1130) configuration data that specifies that the processed record should be stored at the identified location, and then ends. Otherwise, the control plane process generates (at 1135) configuration data that specifies that the processed record should be stored in a secondary table for the set of two or more match-table records that have collided to the same location in the primary table (i.e., have colliding primary-table hash values).

By the time that the CP process 1100 executes to identify a storage location for the processed record selected at 1105, previous iterations of the CP process 1100 might have already specified a secondary table for a set of two or more match-table records that collided in the same primary-table location as the processed record selected at 1105. If such a secondary table was previously created, the process 1100 determines (at 1135) whether the processed record collides with one of the previously stored match-table records in this secondary table (i.e., whether the hash value computed for the processed record by using the secondary table's hash function collides with the hash value computed with this hash function for one of the previously stored record in the secondary table). If not, the process transitions to 1140.

On the other hand, when the processed record collides with one of the previously stored match-table records in this secondary table, the CP process 1100 defines (at 1135) a new secondary table in the external memory 850 to replace the previously specified secondary table for the previously identified set of match-table records that collided in the same primary-table location as the processed record selected at 1105. The CP process 1100 also defines (at 1135) a new secondary table in the external memory when it detects a first collision in the identified primary table location (i.e., upon identifying the second match-table record that maps to a primary table location after identifying the first match-table record mapping to this location).

In some embodiments, each time the CP process defines a new secondary table for a set of two or more match-table records that collide in the primary table, the CP process selects (at 1140) a secondary hash function that does not produce colliding secondary hash values for the records in this set. Next, at 1145, the CP process generates configuration data that specifies that the processed record should be stored at an address location generated by applying the secondary table's hash function to the processed record's match attribute set. When a new secondary table was specified at 1140, the CP process also generates configuration data that specifies that the previously processed match records (that collided with the current processed match record in the primary table) should be stored in the newly specified secondary table at hash address locations computed by applying this table's hash function to the match attribute sets of the match records.

When a new secondary table was specified at 1140, the CP process also generates (at 1150) configuration data that specifies that at the colliding location in the primary table (i.e., the location identified at 1120) a reference should be stored to the new secondary table specified at 1135. This configuration data also specifies the storage at this location of parameters for identifying the secondary hash function (e.g., hash function parameters) specified for this secondary table at 1140.

Lastly, when a new secondary table was specified at 1140, the CP process discards (at 1155) from the external memory any secondary table that it previously created for the colliding set of match table records (i.e., records that collided with the processed record) in prior iterations of its execution. Thus, after creating an initial secondary table, each time the CP process creates another secondary table for a colliding location in the primary table, the process (1) creates (at 1135) a new secondary table at a new location in the external memory, (2) stores (at 1145) all the colliding records in this new secondary table, (3) updates (at 1150) the colliding location (e.g., the identified row) in the primary table with a new reference to the new secondary table and with new secondary hash function identifiers, and then (4) releases (at 1155) the memory occupied by the old secondary table, which is no longer referenced by the primary table.

Each time the process 1100 stores a match record (at 1115, 1130, or 1145) in a data plane or external memory, the process 1100 in some embodiments also stores a corresponding action in the data plane or external memory that that data plane or an FPGA has to perform on any received data message that matches the match record (e.g., has a five tuple that matches the match record). After 1155, the process 1100 ends.

Figure 12:
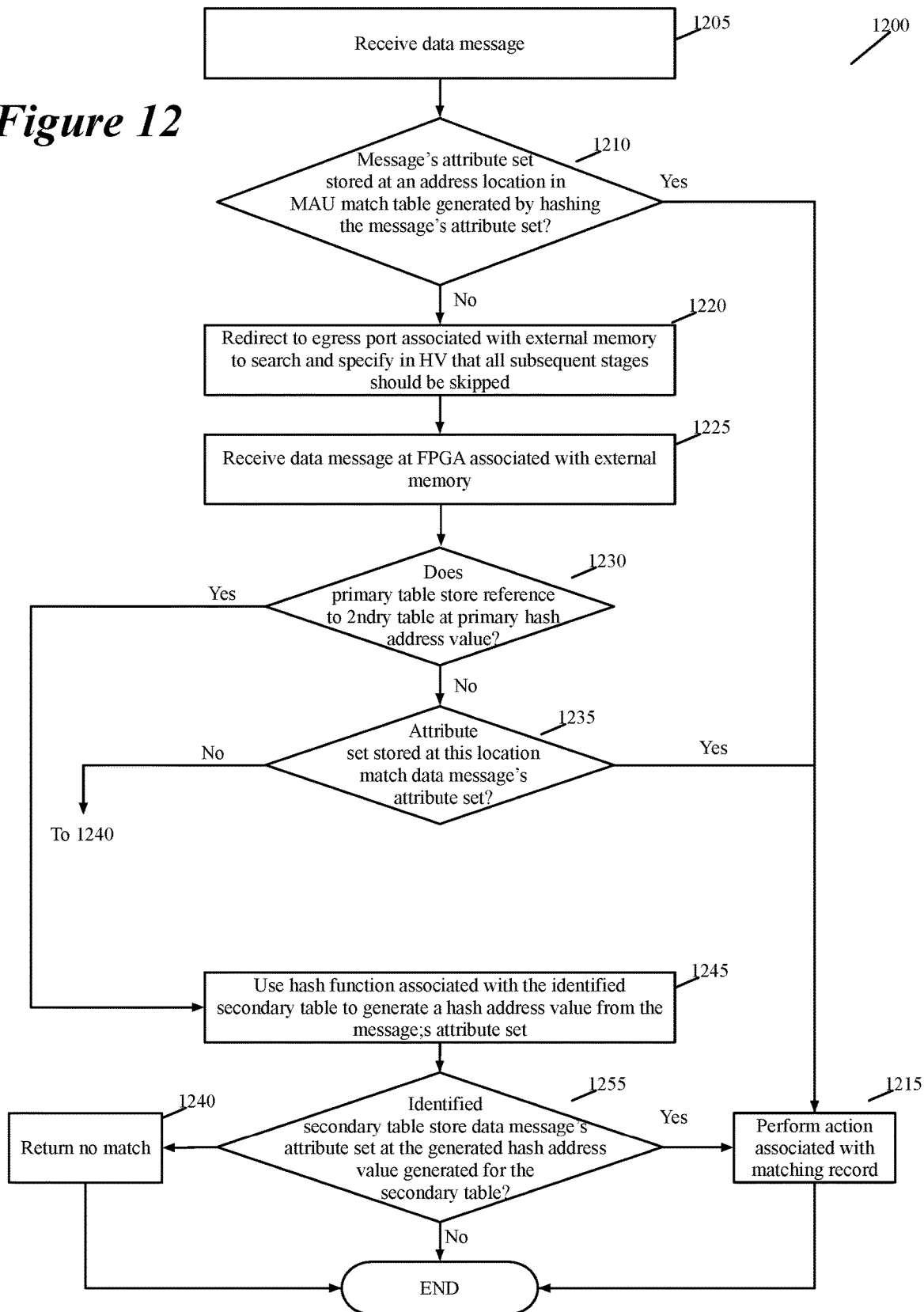
FIG. 12 presents a process that conceptually illustrates how the data plane processes a data message for a particular match table that is implemented by an MAU stage and an external memory accessed by an FPGA.

FIG. 12 presents a process 1200 that conceptually illustrates how the data plane processes a data message for a particular match table that is implemented by an MAU stage and an external memory accessed by an FPGA. This process shows how some embodiments use the primary and secondary tables of FIG. 10 during the data-plane's packet processing runtime. As shown, the process 1200 initially receives (at 1205) a data message at an ingress pipeline of the data plane. This data message is processed by one or more message processing stages of this ingress pipeline until it reaches the particular MAU stage that includes the match table that is implemented by the MAU stage and the external memory 850.

Next, at 1210, the MAU stage determines whether the data message's attribute set (e.g., its five tuple identifier) matches the match attribute set of a non-default match record stored in its match table. In some embodiments, the MAU match table is a hash addressable table that has a corresponding redirection to the FPGA's associated DP egress port when a data message does not match a match-table record at a location identified by the hash of the data message's attribute set.

In these embodiments, the MAU generates a hash address value by applying a hash function to a received data message's attribute set (e.g., five tuple identifier). The MAU then determines whether the match-table record at this address value stores an attribute set that matches the data message's attribute set. If so, the MAU performs (at 1215) the action associated with this matching record on the data message (e.g., by adjusting one or more values in the data message's header vector that the MAU processes), and then ends (i.e., the data message's processing continues from the next MAU stage after the MAU stage).

Otherwise, when the data message's attribute set (e.g., its five tuple identifier) does not match the attribute set of the addressed record in the MAU's match table, the MAU in some embodiment redirects (at 1220) the data message to the DP egress port associated with the FPGA/external memory circuit. In some embodiments, the MAU also marks (at 1220) the header vector of this data message to indicate that all other subsequent message processing stages before the specified DP egress port should skip the processing of the data message. The MAU in some embodiments also marks the data message with metadata that identifies the MAU's stage so that this metadata can be forwarded to the FPGA and used by the FPGA when returning the processed data message back to the data plane.

Also, in some embodiments, the MAU also stores (at 1220) in the header vector the primary hash value that the FPGA needs to use to identify a location in the primary table to examine. The MAU includes this primary hash value in some embodiments to reduce the computational load on the FPGA. In some embodiments, the primary hash value included in the header vector is the hash value computed by the MAU's hash generator, but with a larger set of bits corresponding to the larger size of the primary table in the external memory (as compared to the smaller size of the MAU's match table).

When the MAU is in the ingress pipeline, the data plane's traffic manager directs the data message to the egress pipeline associated with the FPGA's DP egress port. Through this DP egress port, the memory circuit's associated FPGA receives (at 1225) the data message along with metadata (e.g., an identifier that specifies the MAU stage that contained the smaller match table that was examined). Next, at 1230, the FPGA determines whether the primary table stores a reference to a secondary table at a location identified by a primary hash of the data message's attribute set. As mentioned above, the MAU in some embodiments includes this hash value with the data message. In other embodiments, the FPGA computes this hash value by using its own hash generator to compute the primary hash function based on the data message's attribute set (e.g., its five-tuple identifier).

When the FPGA determines (at 1230) that the primary table does not store a reference to a secondary table at a location specified by a primary hash of the data message's attribute set, the FPGA determines (at 1235) whether the data message's attribute set matches the attribute set stored at the specified location in the primary table. If not, the FPGA in some embodiments returns (at 1240) the data message with a no-match notification to the particular data plane message processing stage through the DP ingress port that is associated with this stage's message processing pipeline.

In some embodiments, the FPGA appends metadata to the redirected data message that identifies the message processing stages that should be skipped (e.g., by identifying a number of ingress processing stages that should be skipped, or identifying the first ingress processing stage that should be performed) for the redirected data message. The FPGA in some embodiments specifies the MAU stage from where the processing needs to start again in the data plane by using the metadata forwarded by the data plane. In other embodiments, the data plane statically determines the MAU stage that should resume the processing based on the ingress port at which the redirected message is received. After 1240, the process 1200 ends, and the data message's processing continues from the next MAU stage after the particular MAU stage.

On the other hand, when FPGA determines (at 1235) that the data message's attribute set matches the attribute set stored at the specified location in the primary table, the FPGA in some embodiments performs (at 1215) the action associated with this record, and then redirects the data message back to the message processing pipeline that includes the particular MAU stage with the corresponding match table. To send the data message back, the FPGA uses a DP ingress port associated with the message processing pipeline of the particular MAU stage. In other embodiments, the FPGA does not perform (at 1215) the action associated with the identified matching record, but sends (at 1215) a notification that identifies the matching record to the particular MAU stage and/or action that has to be performed, again through the DP ingress port associated with the message processing pipeline associated with the particular MAU stage.

As mentioned above, the storing FPGA appends (at 1215) metadata to the redirected data message that identifies the message processing stages that should be skipped (e.g., by identifying a number of ingress processing stages that should be skipped, or identifying the first ingress processing stage that should be performed) for the redirected data message. In other embodiments, this determination is made statically based on the ingress port at which the redirected message is received. After 1215, the data message's processing continues from the next MAU stage after the particular MAU stage.

When the FPGA determines (at 1230) that the record at the primary hash address value in the primary table stores a reference to a secondary table, the FPGA uses (1245) this secondary table's hash function to compute a secondary hash value from the data message's attribute set, and then uses this secondary hash value to identify a location in the referenced secondary table. When the primary table record stores a reference to a secondary table, the record in some embodiments also stores a set of identifiers for specifying the secondary hash function associated with the referenced secondary table.

The FPGA then determines (at 1255) whether the identified location in the secondary table (i.e., the location identified by the secondary hash value address) stores a record that has an attribute set that matches the data message's attribute set. If so, the FPGA performs (at 1215) the action associated with this record, and then redirects the data message back to the same message processing pipeline that includes the particular MAU stage with the corresponding match table. Again, to send the data message back, the FPGA uses a DP ingress port associated with the message processing pipeline of the particular MAU stage, and in some embodiments, appends metadata that identifies the message processing stages to skip.

As mentioned above, the FPGA in some embodiments does not perform (at 1215) the action associated with the identified matching record in the secondary table, but sends (at 1215) a notification that identifies the matching record to the particular MAU stage and/or action that has to be performed, again through the DP ingress port associated with the message processing pipeline associated with the particular MAU stage. After 1215, the data message's processing continues from the next MAU stage after the particular MAU stage.

When the FPGA determines (at 1255) that the identified record in the secondary table does not match the data message's attribute set, the FPGA returns (at 1240) the data message with a no-match notification to the particular data plane message processing stage through the DP ingress port associated with this stage's message processing pipeline, and in some embodiments, appends metadata that identifies the message processing stages to skip. After 1240, the process 1200 ends and the data message's processing continues from the next MAU stage after the particular MAU stage.

One of ordinary skill will realize that other embodiments differently implement large, hash-addressable tables for a data plane in external memories. For instance, some embodiments do not include a smaller, hash-addressable table in the data plane in conjunction with the larger, hash-addressable tables in the external memories. Also, some embodiments use multiple external memories to implement the large, hash-addressable table. These embodiments have the data plane perform load balancing operations to distribute the storage and access load across these external memories. Other embodiments replicate the large match table identically across all the external memories.

Some embodiments provide novel circuits for recording data messages received by a data plane circuit of a forwarding element in an external memory outside of the data plane circuit. The external memory in some embodiments is outside of the forwarding element. In some embodiments, the data plane circuit encapsulates the received data messages that should be recorded with encapsulation headers, inserts into these headers addresses that identify locations for storing these data messages in a memory external to the data plane circuit, and forwards these encapsulated data messages so that these messages can be stored in the external memory by another circuit. Instead of encapsulating received data messages for storage, the data plane circuit in some embodiments encapsulates copies of the received data messages for storage. Accordingly, in these embodiments, the data plane circuit makes copies of the data messages that it needs to record.

To perform these operations, three sets of message processing stages of the data plane circuit are configured to perform three different sets of operations. For instance, some embodiments configure (1) a first set of DP MAUs to identify a subset of data messages received by the data plane for recording in the external memory, (2) a second set of DP MAUs to specify external memory addresses to store the identified subset of data messages in the external memory, and (3) a third set of DP MAUs to specify encapsulation headers with the specified external memory addresses for encapsulating the identified subset of data messages, or copies of these data messages. The data plane circuit in some embodiments forwards the encapsulated data messages through one or more of its egress ports.

Figure 13:
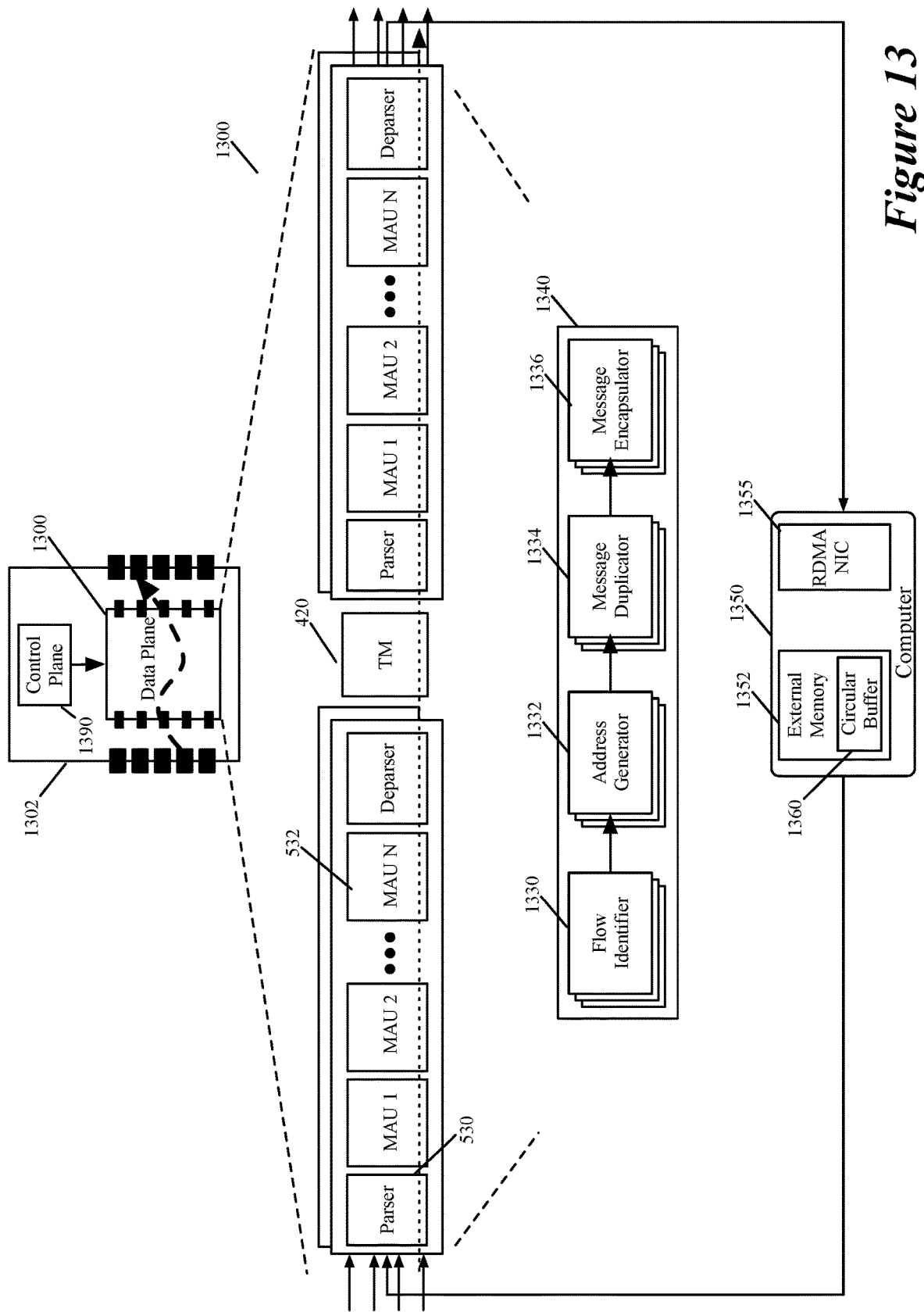
FIG. 13 illustrates an example of a data plane circuit of some embodiments that records data messages that it receives in an external memory.

FIG. 13 illustrates an example of a data plane circuit 1300 of some embodiments. This data plane circuit 1300 is part of a forwarding element 1302 along with a control plane circuit 1390. The data plane circuit 1300 records copies of a subset of the data messages that it receives in an external memory. In this example, this data plane circuit 1300 forwards encapsulated copies of the data messages that it identifies for recording to a memory 1352 of a computer 1350 connected to its forwarding element (e.g., a computer in the same network as its forwarding element, or a computer with a hardwired or wireless connection to its forwarding element).

The forwarding element in some embodiments is a top of rack switch, while in other embodiments it is another type of switch or router. In some embodiments, a network interface card (NIC) 1355 of the computer 1350 receives the encapsulated data messages, removes the encapsulating headers of these messages, extracts the external memory address from these headers and stores the data messages in the computer's memory 1352 at the extracted address locations. The external memory 1352 in some embodiments is the random access memory (e.g., the dynamic random access memory) of the computer, while in other embodiments it is another memory of the computer. The data messages in some embodiments are stored in circular buffers 1360 that are defined in the external memory location.

As shown in FIG. 13, the MAUs of the data plane circuit 1300 are configured to implement several sets of message recording circuits 1340 that perform the message identification, replication and recordation operations of the data plane circuit 1300. Each recording circuit set includes a flow identifier 1330, an address generator 1332, a message replicator 1334 and a message encapsulator 1336. In some embodiments, the flow identifiers 1330 and address generators 1332 are implemented in the ingress pipelines, while the message encapsulators 1336 are implemented in the egress pipelines. The message replicators 1334 are implemented in the deparser of the ingress pipelines in some embodiments, while they are implemented in the traffic managers in other embodiments.

In some embodiments, each ingress pipeline implements a flow identifier and address generator of a recording circuit set, while each egress pipeline implements the message encapsulator of a recording circuit set. When the message replicators 1334 are implemented by the deparsers of ingress pipelines, each ingress pipeline's deparser in some embodiments performs the message replication operation of the message replicator in its ingress pipeline.

Some embodiments do not configure all ingress and egress pipelines to implement a recording circuit. For instance, some embodiments only configure one ingress pipeline (e.g., an ingress pipeline associated with a particular port) and one egress pipeline to implement only one recording circuit 1340 in the data plane circuit 1300. Other embodiments implement more than one recording circuit, but do not implement such a circuit in each ingress and egress pipeline. Also, some embodiments implement the flow identifier and address generator in each ingress pipeline, but only implement the message encapsulator(s) in a subset (e.g., one or two) of the egress pipelines.

The flow identifier 1330 of a recording circuit identifies the subset of data messages that are received by the data plane circuit and that need to be recorded in the external memory 1352 of the computer 1350. To configure a first set of one or more MAUs to implement a flow identifier 1330, the control plane circuit 1390 of the forwarding element 1302 stores in the first MAU set, a set of one or more records to compare with the received data messages to identify data messages that have sets of attributes that match at least one record. In some embodiments, each record includes a set of attributes (e.g., five tuple values) that are to be compared with the set of attributes of a received message (e.g., the message's five tuple identifier) in order to determine whether the record matches the data message. When more than one records are stored, the different records identify the different data message flows that should be stored in the external memory.

In some embodiments, a flow identifier 1330 only specifies a subset of the matching data messages for recording, because it is configured to only select samples of the matching data messages (i.e., because it only performs sampling). To do this, the MAUs that implement the flow identifier in some embodiments maintain counts of the number of matching data messages that have been identified for each flow. These MAUs maintain such counts in their stateful arithmetic logic units (ALUs) as further described below. Only when the maintained count for a matching data message has a certain value (e.g., every $5^{th}$ value, $10^{th}$ value, or Nth value), the flow identifier designates the matching data message as one that should be recorded.

When a flow identifier 1330 identifies a data message as one that should be recorded, the flow identifier records a flag in the header vector associated with the data message to indicate that the data message should be replicated and then recorded in the external memory 1352. When an address generator 1332 receives such a header vector, the address generator 1332 generates an external memory address of a location in the external memory 1332 for storing the identified data message. In some embodiments, an address generator of a recording circuit is implemented by the same set of MAUs that implement its flow identifier, while in other embodiments it is implemented by a different set of MAUs or an overlapping set of MAUs.

In some embodiments, the address generator 1332 of a recording circuit generates different external memory addresses for successive data messages in a data message flow that is identified by the flow identifier as data messages that should be recorded in the external memory. These different addresses specify different locations in the external memory for storing the successive data messages. The address generator in some embodiments generates the different external memory addresses by incrementing an address counter.

In some embodiments, the external memory 1352 includes a circular buffer 1360, and the address counter 1332 generates addresses for this circular buffer by resetting the generated address to a start of an address range after reaching an end of an address range. When the data plane circuit 1300 implements multiple recording circuits 1340, the address generators 1332 of the different recording circuits in some embodiments generate addresses in different address ranges for (e.g., addresses for different circular buffers 1360 in) the external memory 1332. After generating an address for a data message that should be recorded, the address generator stores the generated address in the header vector of the data message.

When a header vector of a data message includes a flag indicating that the data message should be duplicated for recording, the message replicator 1334 duplicates the data message. For the duplicate message, the message replicator in some embodiments specifies an egress port associated with an egress pipeline that should process the duplicate message in order to have its message encapsulator 1336 specify an encapsulation header for the data message. In other embodiments, this egress port is specified by the flow identifier 1330 or address generator 1332 of the replicating circuit 1340.

In some embodiments, the message replicator 1334 is implemented by the deparser of the ingress pipelines that implements the flow identifier 1330 that identified the data message for recording and the address generator 1332 that generated the external memory address for this data message. In other embodiments, the message replicator 1334 is implemented in the traffic manager 420 that routes data messages from ingress pipelines 410 to egress pipelines 415.

After its duplication, the traffic manager provides the original data message to the egress pipeline of the egress port that is associated with the original data message's destination, and provides the duplicate data message to the egress pipeline of the egress port that is associated with the computer 1350. When the duplicate data message is processed by a different egress pipeline than the original data message, the duplicate data message in some embodiments is stored in a different queue in the traffic manager than the original data message, as different egress pipelines are associated with different queues in the traffic manager.

In some embodiments, multiple recording computers 1350 are used to record different identified data message flows, in order to spread the recording load among multiple computers. In these embodiments, the recording circuits 1340 (e.g., the flow identifiers 1330, the address generators 1332 or the message duplicators 1334) identify different egress ports associated with different computers 1350 for different groups of data message flows. Other embodiments use the same computer for some or all of the identified data message flow, but specify different external memories 1352 for different groups of data message flows.

Once a message encapsulator 1336 receives a duplicate data message that should be recorded, the message encapsulator 1336 specifies a set of parameters for an encapsulation header for this data message and stores the specified parameter set in the header vector of the duplicate data message. The specified parameters include the external memory address specified by the address generator 1332 for this data message. The recording circuits 1340 in some embodiments use RoCE encapsulation headers (e.g., RoCEv2 headers) as the NIC 1355 of the computer 1350 is an RDMA NIC that can process RDMA requests and RoCE encapsulation headers. In these embodiments, the message encapsulator 1336 specifies a set of RoCEv2 parameters for the RoCEv2 encapsulation header for each data message that it processes and stores this set of parameters in the header vector of the duplicate data message.

After the message encapsulator 1336 specifies the encapsulating header parameter set and stores this set in the header vector of the data message, the deparser of the encapsulator's egress pipeline extracts this parameter set from the header vector, generates an encapsulating header based on this parameter set, and then encapsulates the duplicate data message that it reconstitutes with this encapsulating header. The deparser reconstitutes the duplicate data message by combining the payload that it receives from the parser with header values that the deparser specifies based on the values in the header vector that it receives for the data message.

The parameter set specified by the message encapsulator in some embodiments includes the network address (e.g., IP address and/or MAC address) associated with the computer as the destination address of the encapsulated, duplicated data message. In other embodiments, this destination address is derived through other mechanisms (e.g., based on configuration data that associates a particular DP egress port with a particular network address). In the encapsulating header of the duplicated data message, the deparser specifies the network address(es) associated with the computer 1355 as the destination network address(es) of the data message. The deparser then provides the encapsulated data message to the egress port specified for this duplicate data message for forwarding to the computer 1355.

Figure 14:
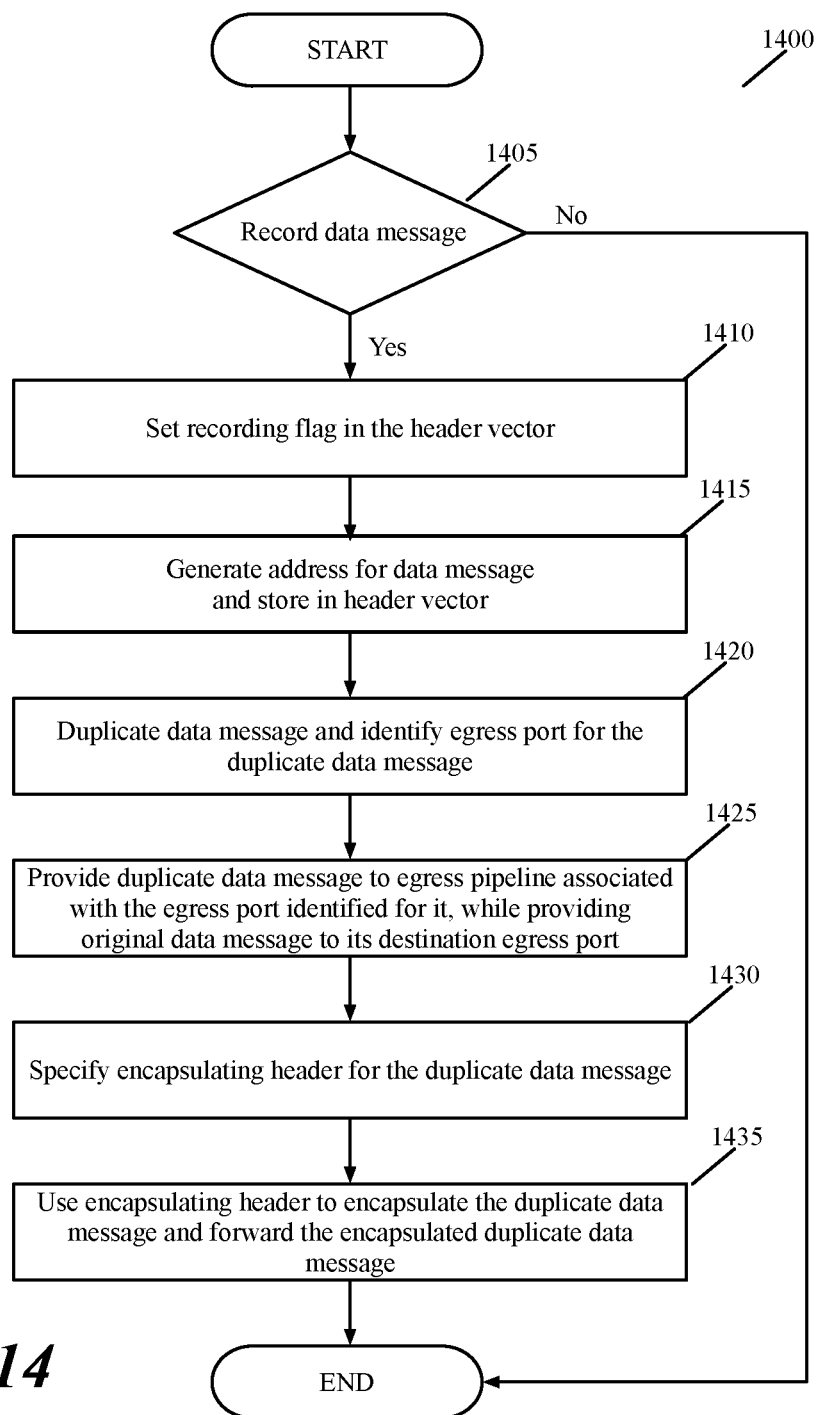
FIG. 14 illustrates the operations performed by a recording circuit for one data message that it receives.

FIG. 14 illustrates the operations performed by a recording circuit 1340 for one data message that it receives. At 1405, the flow identifier 1330 of the recording circuit determines whether the received data message should be recorded in the external memory 1352 of the computer 1350. To make this determination, the flow identifier 1330 of some embodiments compares a set of attributes of the received data message (e.g., its five-tuple identifier) with sets of attributes (e.g., five tuple values) of records that the flow identifier stores. In these embodiments, the records stored by the flow identifier specify the flows that the recording circuit needs to record. Hence, by comparing the data message's attribute set with the attribute sets of its stored records, the flow identifier determines whether the data message belongs to a flow that needs to be recorded.

As mentioned above, the flow identifier 1330 in some embodiments only specifies a subset of the matching data messages for recording, because it is configured to only select samples of the matching data messages (i.e., because it only performs sampling). To do this, the MAUs that implement the flow identifier in some embodiments maintain counts of the number of matching data messages that have been identified for each flow. These MAUs maintain such counts in their stateful arithmetic logic units (ALUs). Only when the maintained count for a matching data message has a certain value (e.g., every $5^{th}$ value, $10^{th}$ value, or Nth value), the flow identifier designates the matching data message as one that should be recorded.

When the flow identifier determines (at 1405) that the received data message does not need to be recorded, the recording process 1400 ends for this data message, i.e., no other component of the recording circuit needs to analyze this data message. On the other hand, when the flow identifier 1330 determines that the data message should be recorded, the flow identifier records (at 1410) a flag in the header vector associated with the data message to indicate that the data message should be replicated and then recorded in the external memory 1352.

Next, at 1415, the address generator 1332 of the recording circuit notes the specified flag in the header vector and based on this flag, generates an external memory address of a location in the external memory 1332 for storing the identified data message. As mentioned above, the address generator 1332 generates different external memory addresses for successive data messages in a data message flow that is recorded in order to specify different locations in the external memory for storing the successive data messages. Also, as mentioned above, the address generator in some embodiments uses an incrementing address counter to generate different external memory addresses in a circular buffer, and resets this counter whenever it reaches the end of the range of addresses in the circular buffer. After generating an address for the received data message, the address generator stores (at 1415) the generated address in the header vector of the data message.

At 1420, the message replicator 1334 of the recording circuit duplicates the data message, and for this message, specifies an egress port associated with an egress pipeline that should process the duplicate message. As mentioned above, the message replicator 1334 in some embodiments is implemented by the deparser of the ingress pipelines that implements the recording circuit, while in other embodiments, the message replicator 1334 is implemented by the traffic manager 420 that routes data messages from ingress pipelines 410 to egress pipelines 415.

After the duplication operation at 1420, the traffic manager provides (at 1425) the original data message to the egress pipeline of the egress port that is associated with the original data message's destination, and provides the duplicate data message to the egress pipeline of the egress port that is associated with the computer 1350. The traffic manager stores the original data message and the duplicate data message in different queues when the duplicate data message is processed by a different egress pipeline than the original data message, Next, at 1430, the replicating circuit's message encapsulator 1336 receives the duplicate data message, specifies a set of parameters for an encapsulation header for this data message and stores the specified parameter set in the header vector of the duplicate data message. In some embodiments, the specified parameter set includes (1) the external memory address specified by the address generator 1332 for this data message, and (2) the network address (e.g., IP address and/or MAC address) associated with the recording computer as the destination address of the encapsulated, duplicated data message. As mentioned above, the encapsulating header is a RoCEv2 encapsulation header in some embodiments.

In some embodiments, RoCE encapsulation requires the data plane circuit to append a trailing CRC (cyclic redundancy check) code to an encapsulated packet. To do this, the message encapsulator 1336 of the data plane circuit 1300 in some embodiments appends a dummy invariant CRC (ICRC) code. These embodiments then configure the RDMA NICs to ignore the invalid ICRC. The NIC in some embodiments ignores the ICRC with the proper configuration when the ICRC is invalid, but ignores the data messages for which the ICRC is missing altogether.

Lastly, at 1435, the deparser of the encapsulator's egress pipeline extracts the encapsulation parameter set from the header vector, generates an encapsulating header based on this parameter set, and then encapsulates the duplicate data message that it reconstitutes with this encapsulating header. In some embodiments, the deparser compiles the payload that it receives from the parser with header values that the deparser specifies based on the values in the header vector that it receives for the data message. The deparser then provides the encapsulated data message to the egress port specified for this duplicate data message for forwarding to the computer 1355.

Figure 15:
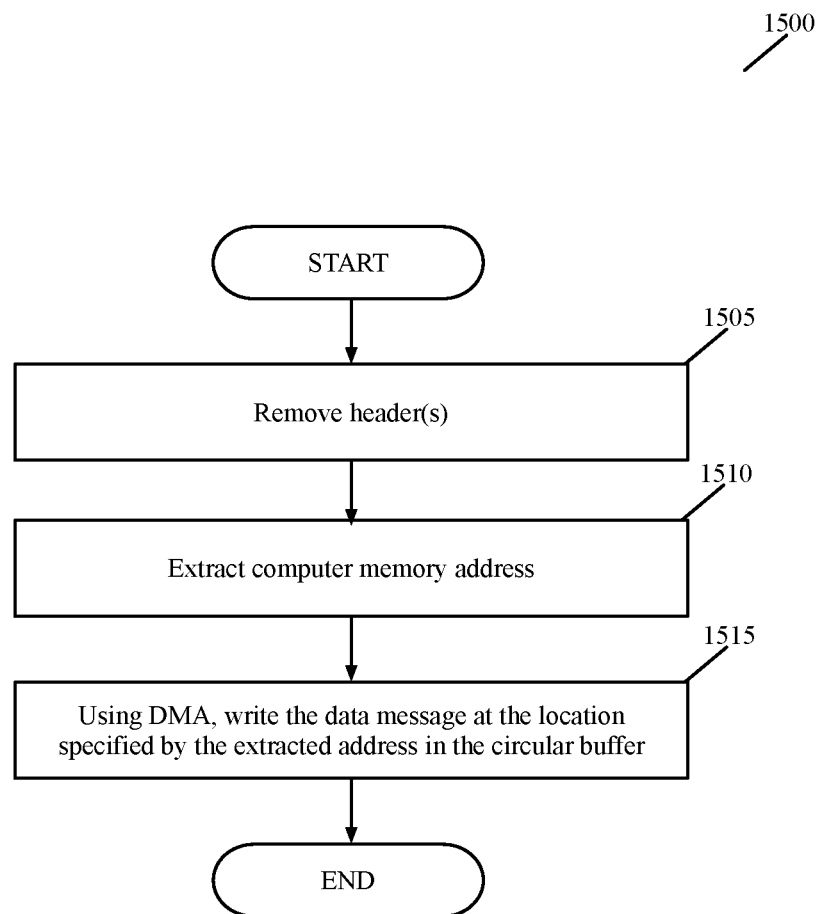
FIG. 15 illustrates a process that the NIC of the computer when it receives an encapsulated data message for recording from the data plane circuit.

FIG. 15 illustrates a process 1500 that the NIC 1355 of the computer 1350 when it receives an encapsulated data message for recording from the data plane circuit 1300. As shown, the NIC initially decapsulates (at 1505) the data message by removing one or more header that encapsulate this data message. This header in some embodiments includes one or more headers associated with RoCEv2. From the removed header, the process 1500 extracts (at 1510) the memory address that specifies a storage location in a circular buffer 1360 of the memory 1352 of the computer. Lastly, at 1515, the process 1500 uses DMA protocols to write the decapsulated data message at the location specified by the extracted address in the circular buffer 1360 of the memory 1352. After 1515, the process ends.

Figure 16:
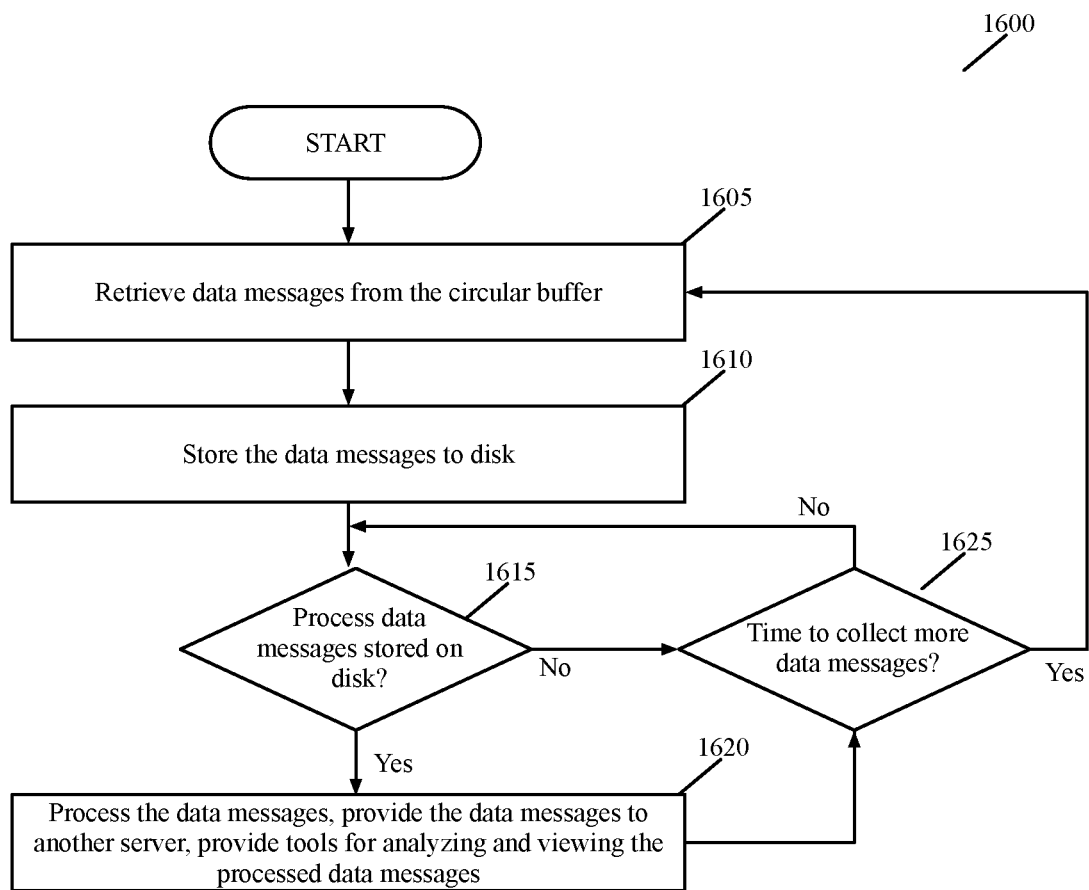
FIG. 16 illustrates a process that a collection and reporting module executing on the computer performs continuously to gather data messages stored in a circular buffer of the memory.

FIG. 16 illustrates a process 1600 that a collection and reporting module executing on the computer 1350 performs continuously to gather data messages stored in a circular buffer 1360 of the memory 1352. When the memory has multiple circular buffers and/or the computer has multiple memories storing multiple groups of data messages, the computer has multiple collection modules collecting data messages from the different circular buffers, and/or has the same collection module collect the data messages from the different circular buffers.

The process 1600 periodically retrieves (at 1605) all the data messages from the circular buffer 1360, and resets the circular buffer (e.g., resets a read location in the circular buffer or sets the values stored in the circular buffer to reset values). In some embodiments, the process retrieves the data messages at a frequency selected to ensure that the data plane circuit 1300 does not overwrite the same locations in the circular buffer before the storage locations are read out by the process 1600. Some embodiments set this frequency and define the size of the circular buffer to minimize the chances that storage locations are overwritten before being read out.

Next, at 1610, the process stores the retrieved data messages to disk on the computer 1352. Next, at 1615, the process 1600 determines whether it should perform one or more sets of operations on the data messages stored on disk. If so, the process transitions to 1620 to perform these operations. In different embodiments, the process 1600 performs different operations on the data messages stored on disk. For instance, in some embodiments, the process 1600 simply aggregates the data messages on disk and reports these data messages to a server for further analysis or reporting to a set of one or more users. In other embodiments, the computer 1352 performs this additional analysis and reporting. Hence, in these embodiments, the process 1600 performs this aggregation and analysis, and provides one or more interfaces (e.g., APIs and/or user interfaces) for allowing a user to access and view the recorded data messages and/or metadata generated by the computer for these messages.

In some embodiments, the process 1600 performs its operations at 1620 less frequently (i.e., at a lower frequency) than it collects data messages from the circular buffer. This is because the circular buffer is smaller than the memory allocated on disk in these embodiments and needs to be emptied out at a faster rate than it needs to be reported or analyzed. From 1620, the process transitions to 1625. The process also transitions to 1625 from 1615 when it determines that it does not need to perform one or more sets of operations on the data messages stored on disk. At 1625, the process determines whether it should empty out the circular buffer again. If so, it returns to 1605. Otherwise, it returns to 1615.

FIG. 16 shows the process 1600 performing the analysis operation 1620 after storing the data message to disk at 1610. Other embodiments, however, perform some or all of the analysis before storing the data message to disk. In some embodiments, the available disk storage is not fast enough to store messages at line rate. Accordingly, in some embodiments, not all messages are written to disk. However, all the data messages will go through some kind of analysis (e.g., filtering, statistics collection, etc.) and a subset are written to disk for further analysis (e.g. offline analysis) at a later time.

Even though FIGS. 13-16 illustrate and describe the use of one external computer with one external memory to store data messages duplicated and forwarded by the data plane circuit 1300, the data plane circuit 1300 in some embodiments duplicates and forwards data messages to multiple destinations, as mentioned above. For instance, in some embodiments, the data plane circuit 1300 duplicates and forwards data messages to multiple computers, multiple NICs in the same computer or different computers and/or multiple memories in the same computer or different computers.

Also, in some embodiments, individual RDMA NICs have multiple ports and the data plane circuit forwards the data messages to duplicate to different ports of the same RDMA NIC. Each port of the NIC in some embodiments is connected to a different egress port of the forwarding element 1302, with such egress port corresponding to a different egress port of the data plane circuit. Some embodiments use for each port multiple queues (called RDMA Queue Pair), each with its own circular buffer in the host memory. Also, the host memory in some embodiments is split across multiple controllers, such as in a NUMA (non-uniform memory access) system, multiple channels, etc.

Also, as mentioned above, the data plane circuit 1300 of some embodiments does not duplicate the data message for storage but forwards the original data message that it captures to the external memory for storage. In some of the embodiments in which the data plane circuit 1300 forwards different captured data message flows to different destinations (e.g., different ports of a NIC, different memories associated with different NICs of a computer, different memories of a computer, and/or different computers, etc.), the data plane circuit 1300 performs load balancing operations to distribute the different captured data message flows among the different destinations. In other embodiments, the data plane circuit 1300 does the load balancing on a per data message basis instead of a per data message flow basis. This works in some embodiments as the data messages are collected and analyzed conjunctively from the different memories associated with the different destinations.

As mentioned above and further described below, the data plane circuit 1300 does not capture every data message in a data message flow but performs a sampling operation that captures samples of the data messages of the message flow. In these or other embodiments, the data plane circuit 1300 performs a rate-limiting operation to ensure that it does not forward messages for storage at a rate that exceeds a particular value. Also, in some embodiments, the data plane circuit 1300 performs pre-processing operations on the data messages that are captured in order to generate metadata for the captured data messages and to append the generated metadata to the data messages that are forwarded to the external memories for storage.

Although several arrangements of the recording circuit 1340 were described above by reference to FIGS. 13-16, one of ordinary skill will realize that this recording circuit is implemented differently in other embodiments. For instance, in some embodiments, the address generator 1332 is positioned after the message duplicator 1334 so that the recording circuit can forward each data message copy to a different destination (e.g., different memory addresses in different computers, etc.).

In some of these embodiments, a recording circuit in an ingress pipeline has a flow identifier 1330 and a message duplicator 1334. The flow identifier matches on a subset of data message headers in order to determine whether a data message needs to be captured. If it needs to be captures, the flow identifier determines how many copies are needed and to which set of destinations these copies need to be sent. In these embodiments, the message duplicator 1334 (working with a mirroring engine/message replication engine of the traffic manager) generates all the requested copies. Through the traffic manager, the copies are sent to the appropriate egress ports through the appropriate egress pipelines. Each data message copy has its destination identifier specifying a specific capture entity, such as a NIC RDMA queue.

In these embodiments, an egress pipeline implements the address generator 1332 and message encapsulator 1336 of the replicating circuit 1340. In some of these embodiments, each destination identifier is mapped to a remote circular buffer. For each message copy, the address generator 1332 generate the "next" address based on the destination identifier. In some embodiments, the address generators use the stateful ALUs of the MAUs to implement address counters with wrap around (reset) feature, as the storages are circular buffers. Once an address is generated for a data message copy, the message encapsulator 1336 adds and populates encapsulation header appropriately based on the destination identifier.

Figure 17:
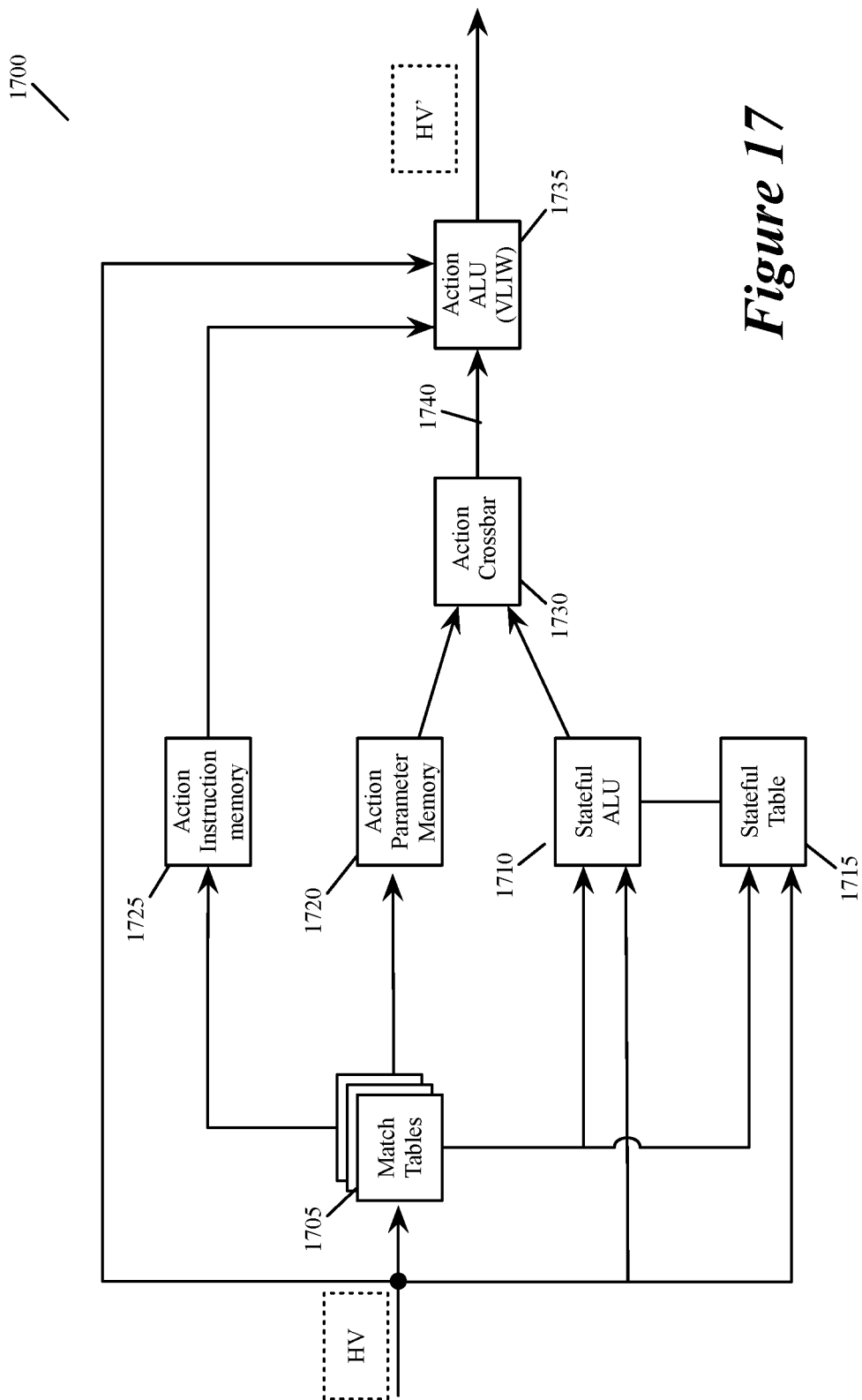
FIG. 17 illustrates a match action unit of some embodiments.

FIG. 17 illustrates a match action unit 532 of some embodiments. As mentioned above, an ingress pipeline 410 or egress pipeline 415 in some embodiments has several MAU stages 532, each of which includes message-processing circuitry for forwarding received data messages and/or performing stateful operations based on header vectors associated with the data message. In some embodiments, the control plane 1390 of the forwarding element 1302 or a remote control plane configures the MAU stages 532 of the data plane 1300 to implement not only the forwarding operations of these MAU stages, but also the recording circuit operations that some of the MAU stages 532 perform. These operations are performed by processing values stored in the header vectors that are generated for the data messages.

In some embodiments, each message processing stage 532 of the data plane 1300 has several (e.g., four) MAUs 532 operating in parallel on the same header vector that is received from the parser 532 or from a previous message processing stage 532. The match-action unit 532 in some embodiments processes a different header vector on every clock cycle, thus ensuring that it operates synchronously with the dataflow of the message-processing pipeline.

As shown, the MAU stage 532 in some embodiments has a set of one or more match tables 1705, a stateful ALU 1710, a stateful table 1715, an action crossbar 1730, an action parameter memory 1720, an action instruction memory 1725, and an action ALU 1735. The match table set 1705 can compare one or more fields in a received message's header vector to identify one or more matching flow entries (i.e., entries that match the message's HV). As mentioned above, the match table set 1705 in some embodiments includes TCAM table and an exact match SRAM table. In some embodiments, the match table set can also include one or more tables that can be accessed at an address that (1) is a value extracted from one or more fields of the message's header vector, or (2) is a hash of this extracted value. In some embodiments, the local control plane, or a remote control plane, supplies flow entries (e.g., the flow-match identifiers and/or action identifiers) to store in one or more match tables and associated action tables.

In some embodiments, the value stored in a match table record that matches a message's flow attributes, or that is accessed at a hash-generated address from one or more message flow attributes, provides addresses of records to access and process in the action parameter memory 1720 and action instruction memory 1725. Conjunctively or alternatively, a match table record in some embodiments has an associated record in the action instruction memory and/or an associated record in the action parameter memory that specifies an action instruction to execute and/or an action parameter to process.

The actions performed by the MAU stage 532 can include actions that the forwarding element has to perform on a received data message to process the data message (e.g., to drop the message, or to forward the message to its destination machine or to other intervening forwarding elements). These actions in some embodiments also include actions associated with a recording circuit of the data plane, such as setting a flag in the header vector regarding the recordation of the data message, the recording of an external memory address in the header vector, etc.

The stateful ALUs 1710 in some embodiments allow the data plane to perform one or more stateful operations, while stateful tables 1715 store state data used and generated by the stateful ALU 1710. Examples of such stateful data in some embodiments includes a count of the number of data messages recorded for a data message flow. In some embodiments, the value stored in a match table record that matches a message's flow identifier, or that is accessed at a hash-generated address, can provide an address and/or parameter for one or more records in the stateful table 1715, and can provide an instruction and/or parameter for the stateful ALU 1710.

As shown, the stateful ALU 1710 and the stateful tables 1715 also receive a processed message's header vector. The header vectors can include instructions and/or parameters for the stateful ALU, while containing addresses and/or parameters for the stateful tables 1715. In some embodiments, the stateful ALUs perform operations synchronously with the data flow of the message-processing pipeline (i.e., synchronously at the data line rate of the data plane 120). In some embodiments, the local or remote control plane provides configuration data to program the stateful ALUs 1710 of the MAUs 532 of the data plane 120.

The stateful ALU 1710 outputs an action parameter to the action crossbar 1730. The action parameter memory 1720 also outputs an action parameter to this crossbar 1730. The action parameter memory 1720 retrieves the action parameter that it outputs from its record that is identified by the address provided by the match table set 1705. The action crossbar 1730 in some embodiments maps the action parameters received from the stateful ALU 1710 and action parameter memory 1720 to an action parameter bus 1740 of the action ALU 1735. This bus provides the action parameter to this ALU 1735. For different data messages, the action crossbar 1730 can map the action parameters from the stateful ALU 1710 and the action parameter memory 1720 differently to this bus 1740. The crossbar can supply the action parameters from either of these sources in their entirety to this bus 1740, or it can concurrently select different portions of these parameters for this bus.

The action ALU 1735 also receives an instruction to execute from the action instruction memory 1725. This memory 1725 retrieves the instruction from its record that is identified by the address provided by the match table set 1705. The action ALU 1735 also receives the header vector for each message that the MAU processes. Such a header vector can also contain a portion or the entirety of an instruction to process and/or a parameter for processing the instruction.

The action ALU 1735 in some embodiments is a very large instruction word (VLIW) processor. The action ALU 1735 executes instructions (from the instruction memory 1725 or the header vector) based on parameters received on the action parameter bus 1740 or contained in the header vector. The action ALU stores the output of its operation in the header vector in order to effectuate a message forwarding operation and/or stateful operation of its MAU stage 532. The output of the action ALU forms a modified header vector (HV') for the next MAU stage or the deparser. In some embodiments, examples of such actions include the writing of a flag or generated address in the header vector. In some embodiments, the parallel-operating MAUs 532 of the same MAU stage 532 write these values to different parts of the header vector.

In other embodiments, the match tables 1705 and the action tables 1715, 1720 and 1725 of the MAU stage 532 can be accessed through other methods as well. For instance, in some embodiments, each action table 1715, 1720 or 1725 can be addressed through a direct addressing scheme, an indirect addressing scheme, and an independent addressing scheme. The addressing scheme that is used depends on the configuration of the MAU stage, which in some embodiments, is fixed for all data messages being processed, while in other embodiments can be different for different data messages being processed.

In the direct addressing scheme, the action table uses the same address that is used to address the matching flow entry in the match table set 1705. As in the case of a match table 1705, this address can be a hash generated address value or a value from the header vector. Specifically, the direct address for an action table can be a hash address that a hash generator (not shown) of the MAU generates by hashing a value from one or more fields of the message's header vector. Alternatively, this direct address can be a value extracted from one or more fields of the header vector.

On the other hand, the indirect addressing scheme accesses an action table by using an address value that is extracted from one or more records that are identified in the match table set 1705 for a message's header vector. As mentioned above, the match table records are identified through direct addressing or record matching operations in some embodiments.

The independent address scheme is similar to the direct addressing scheme except that it does not use the same address that is used to access the match table set 1705. Like the direct addressing scheme, the table address in the independent addressing scheme can either be the value extracted from one or more fields of the message's header vector, or it can be a hash of this extracted value. In some embodiments, not all the action tables 1715, 1720 and 1725 can be accessed through these three addressing schemes, e.g., the action instruction memory 1725 in some embodiments is accessed through only the direct and indirect addressing schemes. Also, other addressing schemes are used to address some of the tables (e.g., action tables).

While the invention has been described with reference to numerous specific details, one of ordinary skill in the art will recognize that the invention can be embodied in other specific forms without departing from the spirit of the invention. For instance, while the data plane circuits of the above-described embodiments store the data messages in the memories of computers, the data plane circuits of other embodiments store metadata regarding these data messages in the external memories of the computers. Accordingly, one of ordinary skill in the art would understand that the invention is not to be limited by the foregoing illustrative details, but rather is to be defined by the appended claims.

The invention claimed is:

1. A method for a data plane (DP) circuit to forward data messages, wherein the DP circuit comprises a plurality of message processing pipelines, ingress and egress ports, and a bridging circuit, the method comprising:
    at least one message processing stage of at least one message processing pipeline of the plurality of message processing pipelines accessing (i) a first plurality of records for matching with a set of one or more data messages received by the DP circuit, and (ii) a redirection record redirecting one or more data messages that do not match one or more of the first plurality of records to a egress port associated with a memory circuit;
    the memory circuit storing a second plurality of records for matching with the one or more data messages received through the egress port associated with the memory circuit; and
    the bridging circuit generating a collision-free hash-value address from a set of attributes of a data message of the one or more data messages received through the egress port, wherein the collision-free hash-value address identifies one of the second plurality of records in the memory circuit.

2. The method of claim 1, wherein the memory circuit storing a second plurality of records for matching with the one or more data messages received through the egress port associated with the memory circuit comprises:
    using, for a data message identifier, a primary hash generator to generate a hash value that identifies a location in a primary storage structure of the memory circuit;
    determining whether the identified location already stores a record; and
    when the identified location does not store any record, storing the data message identifier at the identified location of the primary storage structure.

3. The method of claim 2, wherein the memory circuit storing a second plurality of records for matching with the one or more data messages received through the egress port associated with the memory circuit further comprises:
    when the identified location stores a record, using a secondary hash generator to generate a secondary hash value that identifies a location in a secondary storage structure;
    determining whether the identified location in the secondary storage structure already stores a record; and
    when the identified location in the secondary storage structure does not store a record, storing the data message identifier at the identified location of the secondary storage structure.

4. The method of claim 3, wherein the memory circuit storing a second plurality of records for matching with the one or more data messages received through the egress port associated with the memory circuit further comprises:
    when the identified location in the secondary storage structure stores a record, selecting another secondary hash generator to generate another secondary hash value that identifies a location in another secondary storage structure; and
    storing the data message identifier at the identified location of the another secondary storage structure.

5. The method of claim 4, wherein the data message identifier comprises a first data message identifier that collides with a second data message identifier in the secondary storage structure, wherein the memory circuit storing a second plurality of records for matching with the one or more data messages received through the egress port associated with the memory circuit further comprises:
    for the second data message identifier, using the another secondary hash generator to generate a secondary hash value that identifies a location in the another secondary storage structure; and
    storing the second data message identifier at the location in the another secondary storage structure that is identified by the another secondary hash generator.

6. The method of claim 4, wherein the data message identifier comprises a first data message identifier that collides with a second data message identifier in the secondary storage structure, wherein the memory circuit storing a second plurality of records for matching with the one or more data messages received through the egress port associated with the memory circuit further comprises selecting the another secondary hash generator, from a group of hash generators, to ensure that the another secondary hash generator does not generate colliding hash values for the first and second data message identifiers.

7. The method of claim 6,
    wherein the memory circuit storing a second plurality of records for matching with the one or more data messages received through the egress port associated with the memory circuit further comprises:

identifying the secondary hash generator from a record in the primary storage structure at the location identified by the hash value generated by the primary hash generator; and updating the record in the primary storage structure to identify the another secondary hash generator after selecting the another secondary hash generator.

8. The method of claim 3, wherein the memory circuit storing a second plurality of records for matching with the one or more data messages received through the egress port associated with the memory circuit further comprises identifying the secondary hash generator from the record in the primary storage structure at the location identified by the hash value generated by the primary hash generator.

9. The method of claim 1, wherein the memory circuit connects to the DP circuit through a field programmable device.

10. The method of claim 9, wherein the field programmable device comprises a field programmable gate array (FPGA).

11. The method of claim 1, wherein the generating a collision-free hash-value address from a set of attributes of a data message of the one or more data messages received through the egress port comprises generating a unique address value for a unique set of attributes.

12. The method of claim 1, wherein a record in the first plurality of records specifies an action to perform on a data message in the set of one or more data messages received by the DP circuit and wherein a record in the second plurality of records specifies an action to perform on a data message in the data message of the one or more data messages received through the egress port.

13. A non-transitory machine readable medium storing a program for configuring a data plane (DP) circuit to forward data messages, the DP circuit comprising a plurality of message processing pipelines, ingress and egress ports, a memory circuit, and a bridging circuit, the program for execution by at least one processing unit and comprising one or more sets of instructions for:

configuring at least one message processing stage of the DP circuit to store (i) a first plurality of records for matching with a set of one or more data messages received by the DP circuit, and (ii) a redirection record redirecting one or more data messages that do not match one or more of the first plurality of records to a egress port associated with the memory circuit;

configuring the memory circuit to store a second plurality of records for matching with the one or more data messages received through the egress port associated with the memory circuit; and configuring the bridging circuit to generate a collision-free hash-value address from a set of attributes of a data message of the one or more data messages received through the egress port, wherein the collision-free hash-value address identifies one of the second plurality of records in the memory circuit.

14. The non-transitory machine readable medium of claim 13, wherein a set of instructions for configuring the memory circuit comprise sets of instructions for:

using, for a data message identifier, a primary hash generator to generate a hash value that identifies a location in a primary storage structure of the memory circuit;

determining whether the identified location already stores a record; and when the identified location does not store any record, storing the data message identifier at the identified location of the primary storage structure.

15. The non-transitory machine readable medium of claim 14, wherein the set of instructions for configuring the memory circuit further comprise sets of instructions for:

when the identified location stores a record, using a secondary hash generator to generate a secondary hash value that identifies a location in a secondary storage structure;

determining whether the identified location in the secondary storage structure already stores a record; and when the identified location in the secondary storage structure does not store a record, storing the data message identifier at the identified location of the secondary storage structure.

16. The non-transitory machine readable medium of claim 15, wherein the set of instructions for configuring the memory circuit further comprise sets of instructions for:

when the identified location in the secondary storage structure stores a record, selecting another secondary hash generator to generate another secondary hash value that identifies a location in another secondary storage structure; and storing the data message identifier at the identified location of the another secondary storage structure.

17. The non-transitory machine readable medium of claim 16, wherein the data message identifier comprises a first data message identifier that collides with a second data message identifier in the secondary storage structure, wherein the set of instructions for configuring the memory circuit further comprise sets of instructions for:

for the second data message identifier, using the another secondary hash generator to generate a secondary hash value that identifies a location in the another secondary storage structure; and storing the second data message identifier at the location in the another secondary storage structure that is identified for it by the another secondary hash generator.

18. The non-transitory machine readable medium of claim 17, wherein the data message identifier comprises a first data message identifier that collides with a second data message identifier in the secondary storage structure, wherein the set of instructions for configuring the memory circuit further comprise a set of instructions for selecting the another secondary hash generator, from a group of hash generators, to ensure that the another secondary hash generator does not generate colliding hash values for the first and second data message identifiers.

19. The non-transitory machine readable medium of claim 18, wherein the set of instructions for configuring the memory circuit further comprises sets of instructions for:

identifying the secondary hash generator from a record in the primary storage structure at the location identified by the hash value generated by the primary hash generator; and updating the record in the primary storage structure to identify the another secondary hash generator after selecting the another secondary hash generator.

20. The non-transitory machine readable medium of claim 15, wherein the set of instructions for configuring the memory circuit further comprises a set of instructions for identifying the secondary hash generator from the record in the primary storage structure at the location identified by the hash value generated by the primary hash generator.

21. The non-transitory machine readable medium of claim 13, wherein the memory circuit connects to the DP circuit through a field programmable device.

22. The non-transitory machine readable medium of claim 21, wherein the field programmable device comprises a field programmable gate array (FPGA).

23. The non-transitory machine readable medium of claim 13, wherein a record in the first plurality of records specifies an action to perform on a data message in the set of one or more data messages received by the DP circuit and wherein a record in the second plurality of records specifies an action to perform on a data message in the data message of the one or more data messages received through the egress port.

24. An apparatus comprising:
 a data plane circuit comprising a plurality of message processing pipelines, wherein at least one message processing pipeline of the plurality of message processing pipelines comprises a plurality of stages and wherein at least one stage of the plurality of stages is to access (i) a first plurality of records for matching with a set of one or more data messages received by the data plane circuit and/or (ii) a direction record to direct one or more data messages that do not match one of the first plurality of records to an egress port associated with circuitry, wherein:
 the circuitry is to generate a collision free hash address value from a set of attributes of a data message of the directed one or more data messages received through the egress port, wherein the collision free hash value address is to identify one of a second plurality of records in a memory circuit and wherein the collision free hash value address comprises a unique address value based on a unique set of attributes of a data message.

25. The apparatus of claim 24, wherein the collision free hash address value is based on use of a hash generator that generates an identified location that does not store a record.

26. The apparatus of claim 24, wherein a record in the first plurality of records specifies an action to perform on a data message in the set of one or more data messages received by the data plane circuit and wherein a record in the second plurality of records specifies an action to perform on a data message in the data message of the directed one or more data messages received through the egress port.

* * * * *